(12) United States Patent
Kim et al.

(10) Patent No.: US 11,699,992 B2
(45) Date of Patent: Jul. 11, 2023

(54) SEMICONDUCTOR DEVICE

(71) Applicant: Samsung Electronics Co., Ltd., Suwon-si (KR)

(72) Inventors: Jintae Kim, Daejeon (KR); Byounggon Kang, Seoul (KR); Changbeom Kim, Tongyeong-si (KR); Ha-Young Kim, Seoul (KR); Yongeun Cho, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 201 days.

(21) Appl. No.: 16/726,379

(22) Filed: Dec. 24, 2019

(65) Prior Publication Data

US 2021/0075406 A1  Mar. 11, 2021

(30) Foreign Application Priority Data

Sep. 6, 2019 (KR) .................. 10-2019-0110556

(51) Int. Cl.
| | |
|---|---|
| *H03K 3/037* | (2006.01) |
| *H01L 27/02* | (2006.01) |
| *H01L 23/528* | (2006.01) |
| *H01L 29/06* | (2006.01) |
| *H01L 27/092* | (2006.01) |
| *H01L 23/522* | (2006.01) |
| *H01L 29/423* | (2006.01) |

(52) U.S. Cl.
CPC ....... *H03K 3/0372* (2013.01); *H01L 23/5226* (2013.01); *H01L 23/5286* (2013.01); *H01L 27/0207* (2013.01); *H01L 27/0924* (2013.01); *H01L 29/0673* (2013.01); *H01L 29/42392* (2013.01)

(58) Field of Classification Search
CPC ........... H03K 3/0372; H01L 27/02027; H01L 27/0211; H01L 23/5286; H01L 29/41791; H01L 21/823431; H01L 27/0886; H01L 29/0673; H01L 27/0924
See application file for complete search history.

(56) References Cited

U.S. PATENT DOCUMENTS

| | | |
|---|---|---|
| 8,274,319 B2 | 9/2012 | Maeno |
| 8,856,704 B2 | 10/2014 | Baeg |
| 9,373,611 B2 | 6/2016 | Nishimura et al. |
| 9,641,161 B1 * | 5/2017 | Liu ....................... H01L 27/092 |

(Continued)

*Primary Examiner* — Patrick C Chen
(74) *Attorney, Agent, or Firm* — Muir Patent Law, PLLC

(57) ABSTRACT

A semiconductor device includes a flip flop cell. The flip flop cell is formed on a semiconductor substrate, includes a flip flop circuit, and comprises a scan mux circuit, a master latch circuit, a slave latch circuit, a clock driver circuit, and an output circuit. Each of the scan mux circuit, the master latch circuit, the slave latch circuit, the clock driver circuit, and the output circuit includes a plurality of active devices which together output a resulting signal for that circuit based on inputs, is a sub-circuit of the flip flop circuit, and occupies a continuously-bounded area of the flip flop circuit from a plan view. At least a first sub-circuit and a second sub-circuit of the sub-circuits overlap from the plan view in a first overlap region, the first overlap region including part of a first continuously-bounded area for the first sub-circuit and part of a second continuously-bounded area for the second sub-circuit.

13 Claims, 26 Drawing Sheets

(56) References Cited

U.S. PATENT DOCUMENTS

| | | |
|---|---|---|
| 9,928,337 B2 | 3/2018 | Gothi et al. |
| 9,966,936 B2 | 5/2018 | Kim et al. |
| 10,270,432 B2 | 4/2019 | Liu et al. |
| 10,510,866 B1 * | 12/2019 | Liu .................... H01L 21/32133 |
| 2009/0167394 A1 | 7/2009 | Bosshart |
| 2017/0077910 A1 * | 3/2017 | Kim ............... G01R 31/318541 |
| 2017/0328954 A1 | 11/2017 | Kim et al. |
| 2019/0109586 A1 | 4/2019 | Lee et al. |
| 2019/0198530 A1 * | 6/2019 | Hino ................... H01L 27/0629 |

* cited by examiner

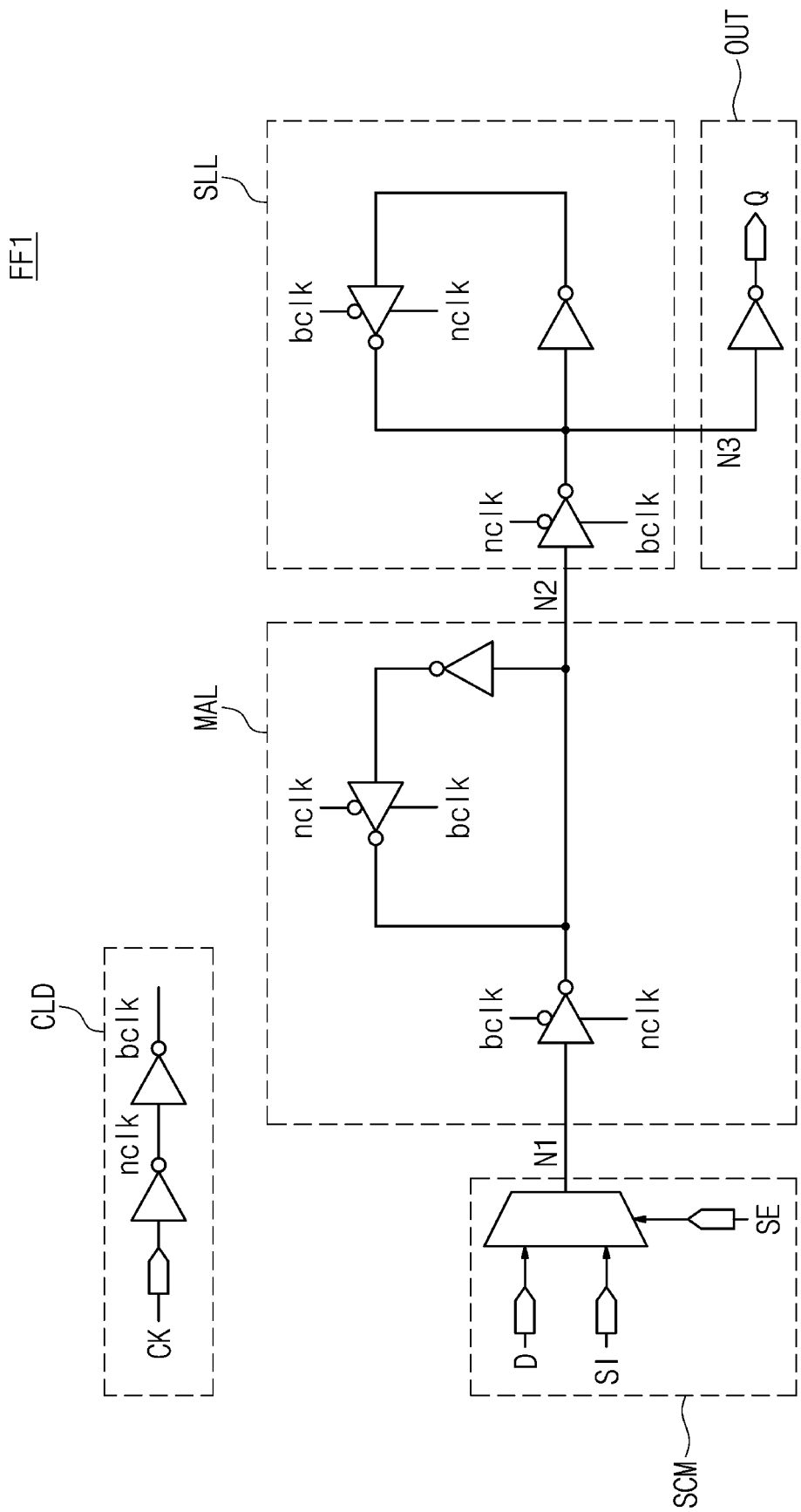

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2019-0110556, filed on Sep. 6, 2019, in the Korean Intellectual Property Office, the entire contents of which are hereby incorporated by reference.

BACKGROUND OF THE INVENTION

The present disclosure relates to a semiconductor device, and in particular, to a semiconductor device including a field effect transistor.

Due to their small-sized, multifunctional, and/or low-cost characteristics, semiconductor devices are being esteemed as important elements in the electronic industry. Semiconductor devices can be classified into semiconductor memory devices for storing data, semiconductor logic devices for processing data, and hybrid semiconductor devices including both of memory and logic elements. As the electronic industry advances, there is an increasing demand for semiconductor devices with improved characteristics. For example, there is an increasing demand for semiconductor devices with high reliability, high performance, and/or multiple functions. To meet this demand, complexity and/or integration density of semiconductor devices are being increased.

SUMMARY

An embodiment of the inventive concept provides a semiconductor device, in which a logic device, such as a flip flop, with improved electric characteristics is provided.

According to some aspects, A semiconductor device includes a flip flop cell. The flip flop cell is formed on a semiconductor substrate, includes a flip flop circuit, and comprises various circuits. A scan MUX circuit is formed in a first continuously-bounded area of the flip flop cell from a plan view. A master latch circuit is formed in a second continuously-bounded area of the flip flop cell from a plan view, the master latch circuit formed to be adjacent to the scan MUX circuit in a plan length direction. A clock driver circuit is formed in a third continuously-bounded area of the flip flop cell from a plan view, the third continuously-bounded area partly overlapping the first continuously-bounded area in a first overlap region, such that a first part of the scan mux circuit in the first overlap region overlaps and is shared with a first part of the clock driver circuit in the first overlap region, and a second part of the scan mux circuit is adjacent to a second part of the clock driver circuit in a plan height direction. An output circuit is formed in a fourth continuously-bounded area of the flip flop cell from a plan view. The flip flop cell further comprises a slave latch circuit. Each of the scan mux circuit, the master latch circuit, the slave latch circuit, the clock driver circuit, and the output circuit includes a plurality of active devices which together output a resulting signal for that circuit based on inputs is a sub-circuit of the flip flop circuit.

According to some aspects, a semiconductor device includes a flip flop cell. The flip flop cell is formed on a semiconductor substrate, includes a flip flop circuit, and comprises a scan mux circuit, a master latch circuit, a slave latch circuit, a clock driver circuit, and an output circuit. Each of the scan mux circuit, the master latch circuit, the slave latch circuit, the clock driver circuit, and the output circuit includes a plurality of active devices which together output a resulting signal for that circuit based on inputs, is a sub-circuit of the flip flop circuit, and occupies a continuously-bounded area of the flip flop circuit from a plan view. At least a first sub-circuit and a second sub-circuit of the sub-circuits overlap from the plan view in a first overlap region, the first overlap region including part of a first continuously-bounded area for the first sub-circuit and part of a second continuously-bounded area for the second sub-circuit.

According to some aspects, a semiconductor device includes a flip flop cell, the flip flop cell formed on a semiconductor substrate and including a flip flop circuit. The flip flop cell comprises a scan mux circuit that includes a plurality of active devices which together output a scan mux signal, a master latch circuit that includes a plurality of active devices which together output a first latch signal, a slave latch circuit that includes a plurality of active devices which together output a second latch signal, a clock driver circuit that includes a plurality of active devices which together output a clock driver signal, and an output circuit that includes a plurality of active devices which together output an output signal for the flip flop circuit. Each of the scan mux circuit, the master latch circuit, the slave latch circuit, the clock driver circuit, and the output circuit forms a respective sub-circuit. Each of the scan mux circuit, the master latch circuit, the slave latch circuit, the clock driver circuit, and the output circuit occupies a respective bounded area of the flip flop circuit from a plan view. A first respective bounded area for a first sub-circuit of the sub-circuits overlaps, from a plan view, a second respective bounded area for a second sub-circuit of the sub-circuits.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 8 is a logic circuit diagram illustrating a flip-flop circuit of a semiconductor device according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
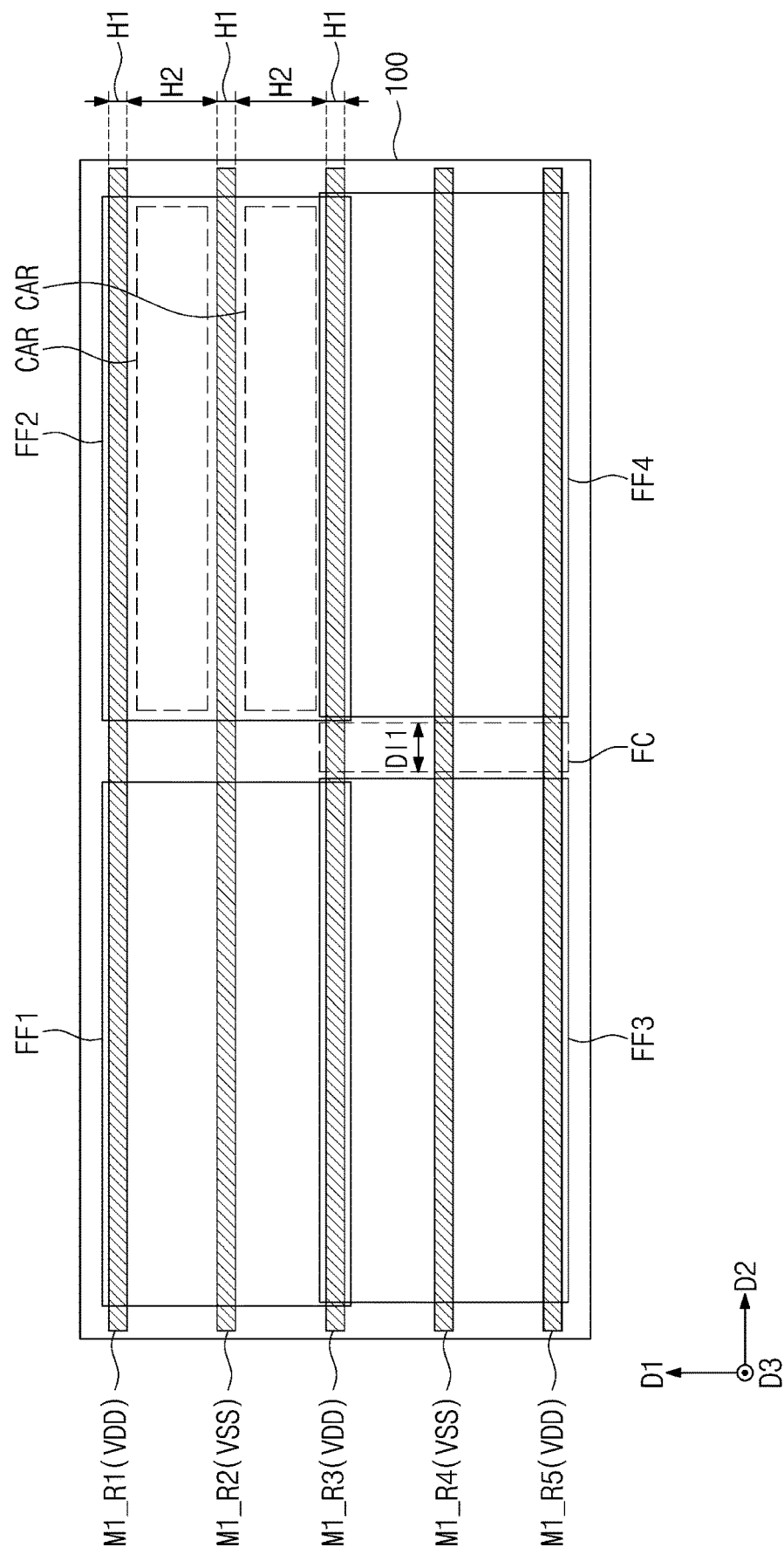
FIG. 1 is a plan view illustrating a logic region of a semiconductor device according to an embodiment of the inventive concept.

FIG. 1 is a plan view illustrating a logic region of a semiconductor device according to an embodiment of the inventive concept. As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices. Semiconductor packages may include a package substrate, one or more semiconductor chips, and an encapsulant formed on the package substrate and covering the semiconductor chips. In one embodiment, the flip flop cells described herein are included in a logic chip such as an application processor.

Referring to FIG. 1, a plurality of flip-flop cells FF1-FF4 may be provided on a logic region of a substrate 100. The flip-flop cells FF1-FF4 may be two-dimensionally arranged on the logic region of the substrate 100. The flip-flop cells FF1-FF4 may include first to fourth flip-flop cells FF1-FF4. For example, each of the first to fourth flip-flop cells FF1-FF4 may be a one-bit flip-flop cell.

The second flip-flop cell FF2 may be adjacent to the first flip-flop cell FF1 in a second direction D2. The first flip-flop cell FF1 may be adjacent to the third flip-flop cell FF3 in a first direction D1. The fourth flip-flop cell FF4 may be adjacent to the third flip-flop cell FF3 in the second direction D2. For the purposes of description herein, the first direction D1 may also be described as a plan height direction, and the second direction D2 may also be described as a plan length direction.

A plurality of power lines M1_R may be provided on the logic region of the substrate 100. The power lines M1_R may include first to fifth power lines M1_R1-M1_R5. The first to fifth power lines M1_R1-M1_R5 may extend in the second direction D2 and may be parallel to each other. A power voltage VDD may be applied to the first, third, and fifth power lines M1_R1, M1_R3, and M1_R5. A ground voltage VSS may be applied to the second and fourth power lines M1_R2 and M1_R4. In certain embodiments, the ground voltage VSS may be applied to the first, third, and fifth power lines M1_R1, M1_R3, and M1_R5, the power voltage VDD may be applied to the second and fourth power lines M1_R2 and M1_R4, but the inventive concept is not limited to this example. For example, the VDD and VSS lines can be arranged in other ways to be in different positions with respect to each other.

The first to third power lines M1_R1, M1_R2, and M1_R3 may be disposed to cross the first and second flip-flop cells FF1 and FF2. The third to fifth power lines M1_R3, M1_R4, and M1_R5 may be disposed to cross the third and fourth flip-flop cells FF3 and FF4. The second power line M1_R2 may cross a center of each of the first and second flip-flop cells FF1 and FF2. The fourth power line M1_R4 may cross a center of each of the third and fourth flip-flop cells FF3 and FF4.

Hereinafter, and similar to the discussion above, a length in the first direction D1 in FIG. 1 may be defined as a 'plan height'. Each of the first to fifth power lines M1_R1-M1_R5 may have a first plan height H1. A distance between adjacent ones of the first to fifth power lines M1_R1-M1_R5 may be a second plan height H2.

The number of steps of a flip-flop cell may be determined depending on the number of active regions CAR included in a single flip-flop cell. A flip-flop cell including one active region CAR may be a one-step flip-flop cell. In the case where, as shown in FIG. 1, each of the flip-flop cells FF1-FF4 includes two active regions CAR, each of the flip-flop cells FF1-FF4 may be a two-step flip-flop cell.

A plan height of an N-step flip-flop cell may be (N+1)×H1+N×H2. For example, a height of a one-step flip-flop cell may be (1+1)×H1+1×H2 (i.e., 2H1+H2). A height of a two-step flip-flop cell FF1-FF4 may be (2+1)×H1+2×H2 (i.e., 3H1+2H2). A height of a three-step flip-flop cell may be (3+1)×H1+3×H2 (i.e., 4H1+3H2).

A filler cell FC may be interposed between the flip-flop cells FF1-FF4, which are adjacent to each other in the second direction D2. The filler cell FC may be a dummy cell that does not have a separate function in aspects of a circuit. A distance between the flip-flop cells FF1-FF4, which are adjacent to each other in the second direction D2 (e.g., in a plan length direction), may be a first distance DI1.

As another example, the flip-flop cells FF1-FF4, which are adjacent to each other in the second direction D2, may contact each other. For example, the filler cell FC may be omitted between the flip-flop cells FF1-FF4, which are adjacent to each other in the second direction D2. In this case, the first distance DI1 may be zero.

Figure 2:
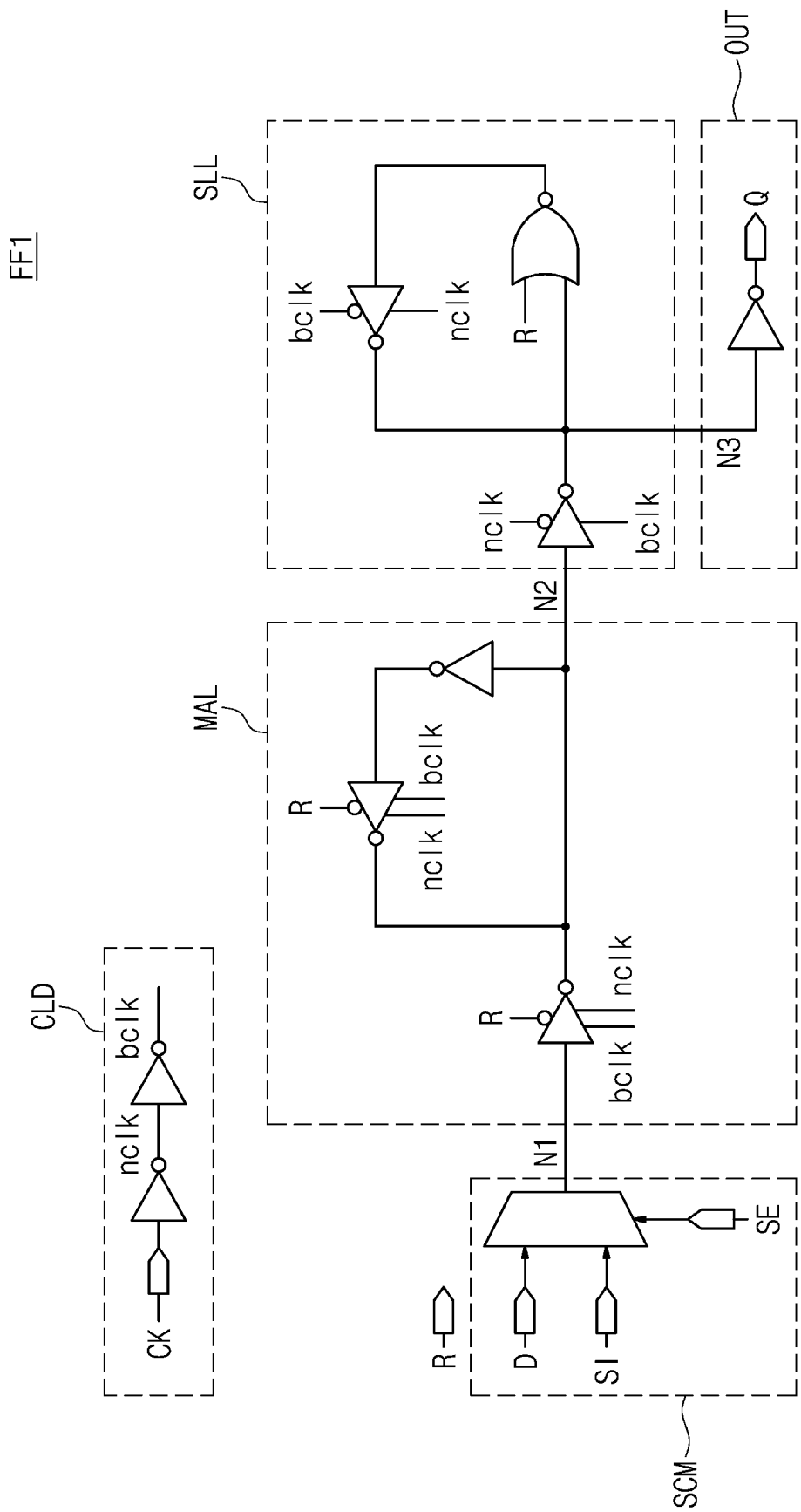
FIG. 2 is a logic circuit diagram illustrating a flip-flop circuit of a semiconductor device according to an embodiment of the inventive concept.

FIG. 2 is a logic circuit diagram illustrating a flip-flop circuit of a semiconductor device according to an embodiment of the inventive concept. Referring to FIG. 2, each of the flip-flop cells FF1-FF4 of FIG. 1 may include the flip-flop circuit of FIG. 2. Hereinafter, the first flip-flop cell FF1 is described as a representative example of the flip-flop cells FF1-FF4.

The first flip-flop cell FF1 may include a scan MUX block SCM, a master latch block MAL, a slave latch block SLL, a clock driver block CLD, and an output block OUT. Each of these blocks comprise circuits, and so the first flip-flop cell FF1 is also described herein as including a scan MUX circuit SCM, a master latch circuit MAL, a slave latch circuit SLL, a clock driver circuit CLD, and an output circuit OUT. Each of these circuits may also be described as a sub-circuit, e.g., a sub-circuit of a flip-flop cell.

In more detail, the clock driver block CLD may be connected to the flip-flop circuit and may include a clock circuit, to which an external clock signal CK is input. The clock driver block CLD may be configured to invert the external clock signal CK to a clock inversion signal nclk. The clock driver block CLD may also be configured to invert the clock inversion signal nclk to a clock signal bclk.

The scan MUX block SCM may be a core circuit, which is used to execute scan and flip-flop functions. The scan MUX block SCM may select one of an external input signal D and a scan input signal SI in response to a scan enable signal SE and then may provide an internal signal to a first node N1, based on the selected signal.

Each of the master latch block MAL and the slave latch block SLL may be a buffer region. The master latch block MAL may latch the internal signal, based on the clock signal bclk. An output of the master latch may be input to the slave latch block SLL through a second node N2.

The slave latch block SLL may latch the output of the master latch, based on the clock signal bclk. An output of the slave latch block SLL may be provided as an output signal Q through a third node N3 and the output block OUT.

Figure 3:
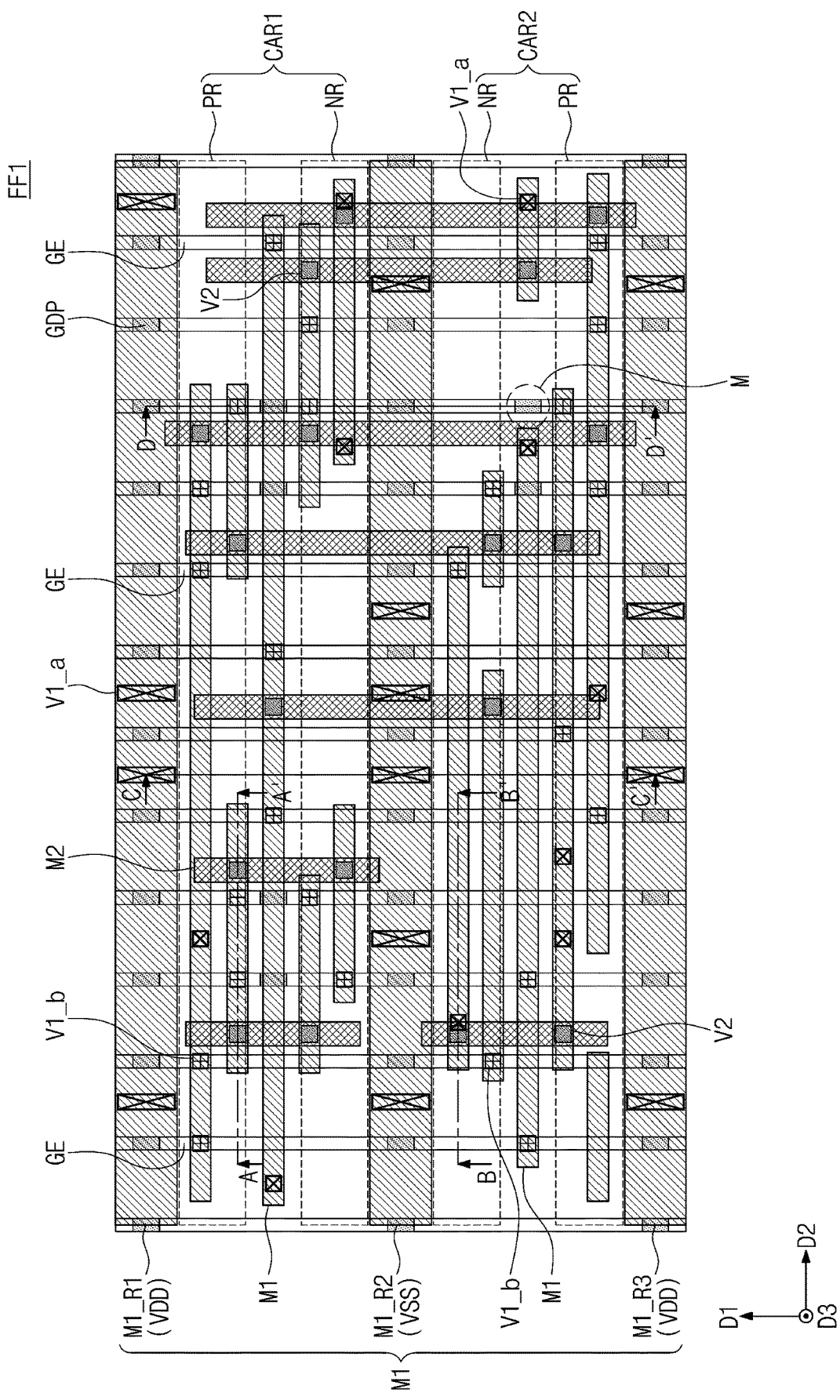
FIG. 3 is a plan view illustrating a flip-flop cell of a semiconductor device according to an embodiment of the inventive concept.
Figure 4:
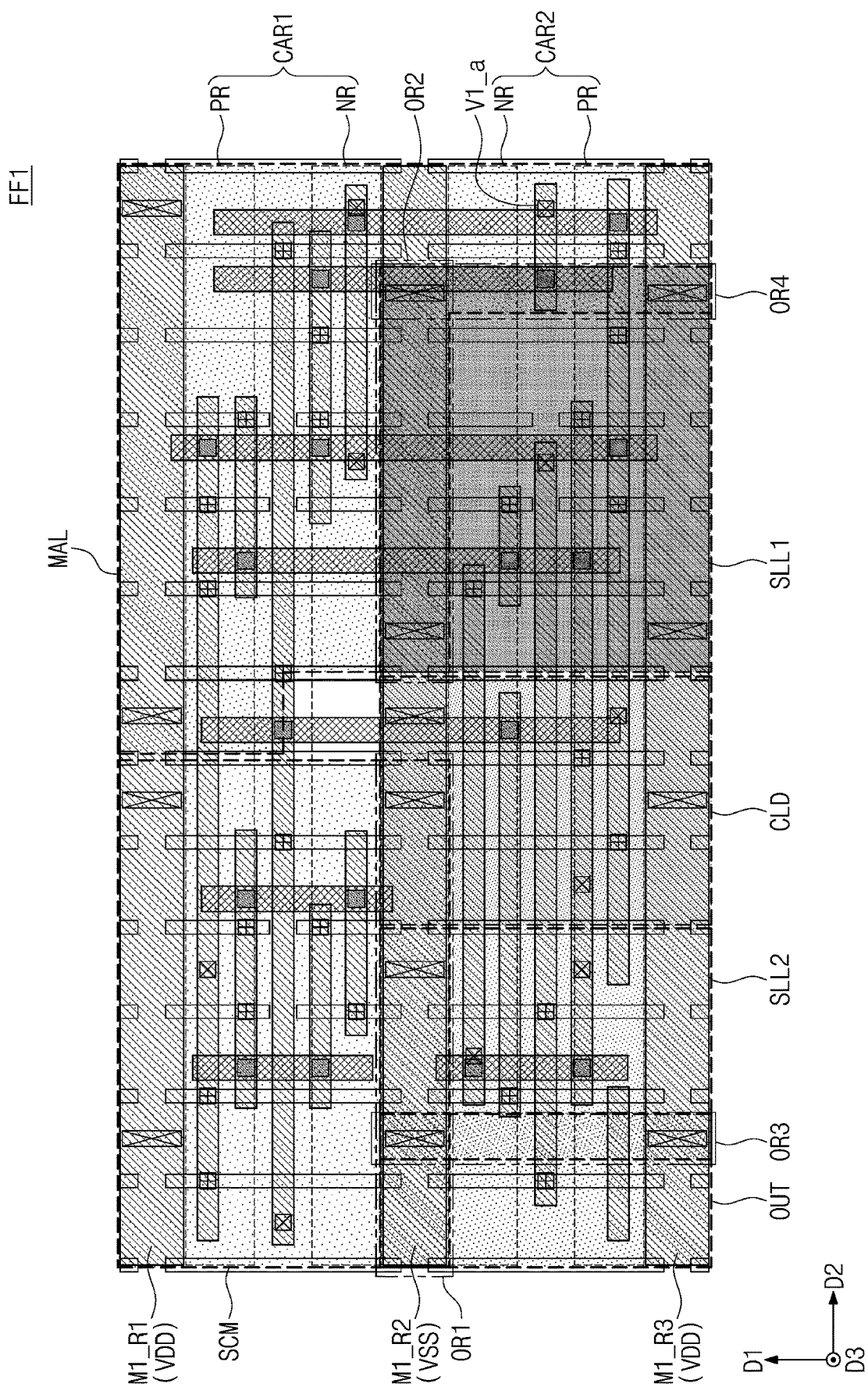
FIG. 4 is a plan view illustrating a plurality of blocks constituting the flip-flop cell of FIG. 3.
Figure 5:
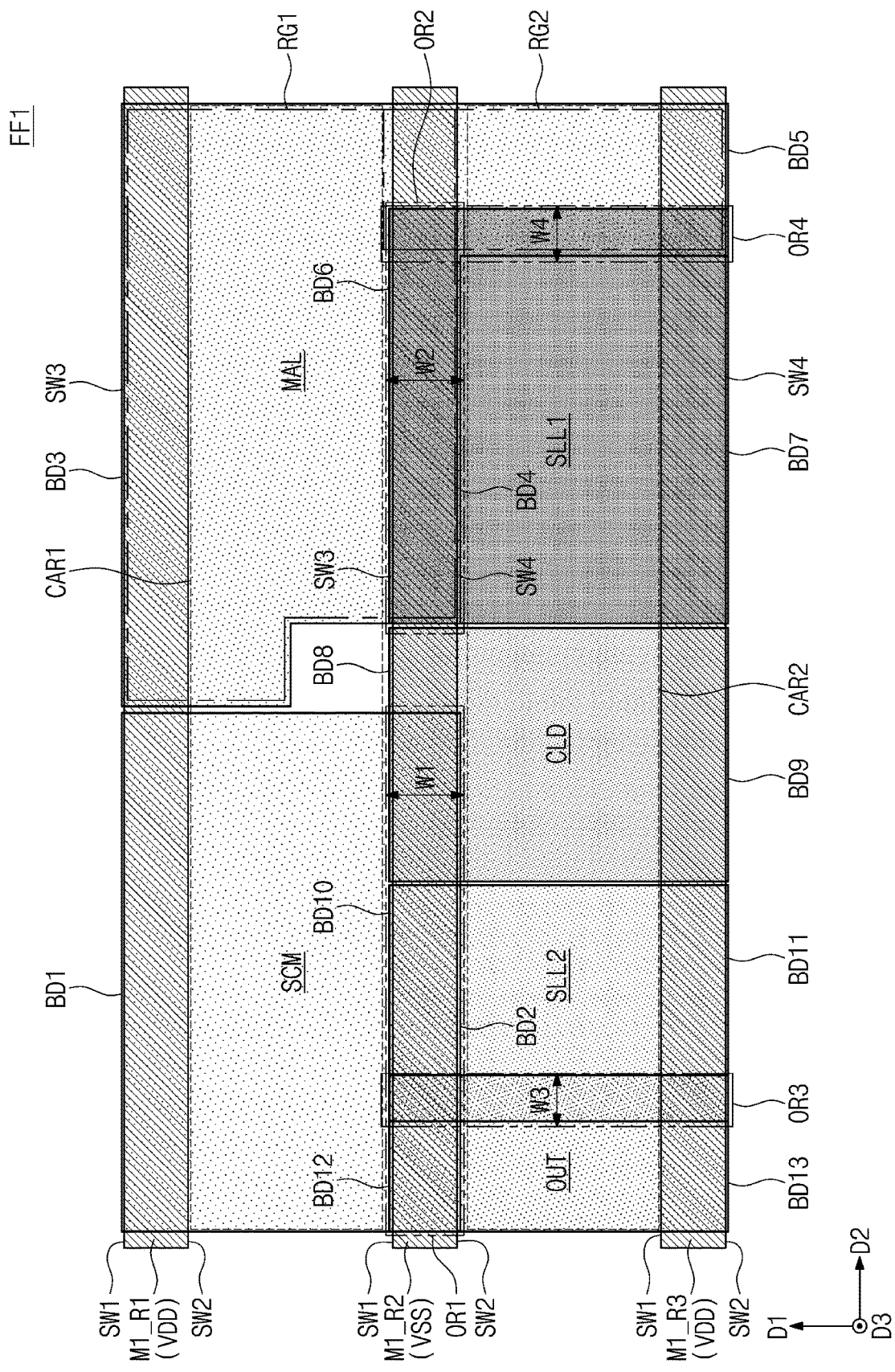
FIG. 5 is a plan view illustrating a plurality of blocks constituting the flip-flop cell of FIG. 4.

FIG. 3 is a plan view illustrating a flip-flop cell of a semiconductor device according to an embodiment of the inventive concept. FIG. 4 is a plan view illustrating a plurality of blocks constituting the flip-flop cell of FIG. 3. FIG. 5 is a plan view illustrating a plurality of blocks constituting the flip-flop cell of FIG. 4. In detail, FIG. 5 illustrates only blocks, which constitute the flip-flop cell shown in the plan view of FIG. 4, but from which concrete patterns shown in FIG. 3 are omitted. The blocks depicted in FIGS. 4 and 5 are also described as continuously-bounded areas, since a continuous boundary surrounds each block in these figures.

Each of the flip-flop cells FF1-FF4 of FIG. 1 may include the flip-flop cell of FIG. 3 provided on the substrate 100. Hereinafter, the first flip-flop cell FF1 may be described as a representative example of the flip-flop cells FF1-FF4.

Referring to FIGS. 1 to 5, the first flip-flop cell FF1 may be provided on the substrate 100. The first flip-flop cell FF1 may include a plurality of logic transistors. First interconnection lines M1 may be provided on the logic transistors. Second interconnection lines M2 may be provided on the first interconnection lines M1. The first interconnection lines M1 may constitute a first metal layer, and the second interconnection lines M2 may constitute a second metal layer. The second metal layer may be placed at a higher vertical level than the first metal layer. A detailed structure of the first flip-flop cell FF1 will be described with reference to FIGS. 6A to 6D.

The first interconnection lines M1 may include the first to third power lines M1_R1, M1_R2, and M1_R3, which extend in the second direction D2 and are parallel to each other. Each of the first to third power lines M1_R1, M1_R2, and M1_R3 may have a first sidewall SW3 and a second sidewall SW4, which are opposite to each other. The first sidewall SW3 and the second sidewall SW4 may extend in the second direction D2 and may be parallel to each other.

A first active region CAR1 may be defined between the first and second power lines M1_R1 and M1_R2. A second active region CAR2 may be defined between the second and third power lines M1_R2 and M1_R3 (e.g., see FIG. 5). Each of the first and second active regions CAR1 and CAR2 may include a p-type metal-oxide-semiconductor field-effect transistor (PMOSFET) region PR and an n-type metal-oxide-semiconductor field-effect transistor (NMOSFET) region NR of the substrate 100. For example, each of the first and second active regions CAR1 and CAR2 may be a complementary metal-oxide-semiconductor field-effect transistor (CMOSFET) region.

The first flip-flop cell FF1 may include the scan MUX block SCM, the master latch block MAL, a first slave latch block SLL1, a second slave latch block SLL2, the clock driver block CLD, and the output block OUT. Each of these blocks may comprise a bounded area, such as a continuously-bounded area. For example, each of these blocks may comprise a continuously-bounded area that includes all or part of a sub-circuit (e.g., all or part of a scan MUX circuit, a master latch circuit, a slave latch circuit, a clock driver circuit, or an output circuit). The first slave latch block SLL1 and the second slave latch block SLL2 may constitute the slave latch circuit SLL of FIG. 2. Each of the scan MUX block SCM, the master latch block MAL, the first slave latch block SLL1, the second slave latch block SLL2, the clock driver block CLD, and the output block OUT may include a circuitry configured to independently execute its own function. For example, each of the scan mux circuit, master latch circuit, slave latch circuit, clock driver circuit, and output circuit represented by the scan MUX block SCM, the master latch block MAL, the combined first slave latch block SLL1 and second slave latch block SLL2, the clock driver block CLD, and the output block OUT, may be a sub-circuit of the flip flop circuit that occupies a bounded area of the flip flop circuit from a plan view, and includes a plurality of active devices, such as transistors, for example, which together output a resulting signal for the sub-circuit based on inputs.

A cell including the first active region CAR1 and the second active region CAR2 may be defined as a multi-plan-height cell. The function blocks SCM, MAL, SLL1, SLL2, CLD, and OUT of the first flip-flop cell FF1 may be two-dimensionally disposed, when viewed in a plan view, on the multi-plan-height cell. According to an embodiment of the inventive concept, the function blocks SCM, MAL, SLL1, SLL2, CLD, and OUT may be efficiently disposed on the multi-plan-height cell, and this may make it possible to improve an integration density and electric characteristics of the first flip-flop cell FF1.

The scan MUX block SCM may be provided on the first active region CAR1. The scan MUX block SCM may include a portion of the first power line M1_R1 and a portion of the second power line M1_R2. In detail, the scan MUX block SCM may have a first border BD1 and a second border BD2. The first border BD1 and the second border BD2 may be opposite to each other in the first direction D1. The first border BD1 and the second border BD2 may extend in the second direction D2. The first border BD1 of the scan MUX block SCM may be aligned with the first sidewall SW3 of the first power line M1_R1, and the second border BD2 of the scan MUX block SCM may be aligned with the second sidewall SW4 of the second power line M1_R2. The scan MUX block SCM may have a rectangular shape to form a continuously-bounded area of the flip flop circuit from a plan view.

The master latch block MAL may be provided on the first and second active regions CAR1 and CAR2. The master latch block MAL may be adjacent to the scan MUX block SCM in the second direction D2. The scan MUX circuit SCM and master latch circuit MAL may be arranged at the same plan height as each other and arranged adjacent to each other in a plan length direction. The master latch block MAL may include a portion of the first power line M1_R1, a portion of the second power line M1_R2, and a portion of the third power line M1_R3.

The master latch block MAL may include a first region RG1 on the first active region CAR1 and a second region RG2 on the second active region CAR2. In this manner, the master latch block MAL may be extended from the first active region CAR1 to the second active region CAR2.

The first region RG1 of the master latch block MAL may have a third border BD3 and a fourth border BD4. The third border BD3 and the fourth border BD4 may be opposite to each other in the first direction D1. The third border BD3 and the fourth border BD4 may extend in the second direction D2. The third border BD3 may be aligned with the first sidewall SW3 of the first power line M1_R1, and the fourth border BD4 may be aligned with the second sidewall SW4 of the second power line M1_R2. The second region RG2 of the master latch block MAL may have a fifth border BD5. The fifth border BD5 may be aligned with the second sidewall SW4 of the third power line M1_R3. The master latch block MAL may have a polygonal shape and may form a continuously-bounded area of the flip flop circuit from a plan view.

The first slave latch block SLL1 may be provided on the second active region CAR2. The first region RG1 of the master latch block MAL may be adjacent to the first slave latch block SLL1 in the first direction D1. The second region RG2 of the master latch block MAL may be adjacent to the first slave latch block SLL1 in the second direction D2. The first slave latch block SLL1 may include a portion of the second power line M1_R2 and a portion of the third power line M1_R3.

The first slave latch block SLL1 may have a sixth border BD6 and a seventh border BD7. The sixth border BD6 and the seventh border BD7 may be opposite to each other in the first direction D1. The sixth border BD6 and the seventh border BD7 may extend in the second direction D2. The sixth border BD6 may be aligned with the first sidewall SW3 of the second power line M1_R2, and the seventh border BD7 may be aligned with the second sidewall SW4 of the third power line M1_R3. The first slave latch block SLL1 may have a rectangular shape and may form a continuously-bounded area of the flip flop circuit from a plan view.

In a second overlap region OR2, the first region RG1 of the master latch block MAL and the first slave latch block SLL1 overlap with each other. The second overlap region OR2 may extend in the second direction D2. The second overlap region OR2 may substantially overlap with the second power line M1_R2. The second overlap region OR2 may have a second width W2 in the first direction D1. The master latch block MAL and the first slave latch block SLL1 may share the second power line M1_R2 through the second overlap region OR2. In this manner, at least a first sub-circuit (e.g., a master latch circuit MAL) and a second sub-circuit (e.g., slave latch block SLL which includes first slave latch block SLL1 and second latch block SLL2) of the sub-circuits that form the flip flop circuit overlap in a plan view in a first overlap region (e.g., OR2). The first overlap region includes part of a first continuously-bounded area for the first sub-circuit, and part of a second continuously-bounded area for the second sub-circuit.

In a fourth overlap region OR4, h the second region RG2 of the master latch block MAL and the first slave latch block SLL1 overlap with each other. The fourth overlap region OR4 may extend in the first direction D1. The fourth overlap region OR4 may have a fourth width W4 in the second direction D2. The fourth width W4 may be smaller than the second width W2.

The master latch block MAL and the first slave latch block SLL1 may share the second active region CAR2 through the fourth overlap region OR4. The second active region CAR2, which is shared by the master latch block MAL and the first slave latch block SLL1, may be a region, to which the second power line M1_R2 and the third power line M1_R3 are electrically connected.

The clock driver block CLD may be provided on the second active region CAR2. The scan MUX block SCM may be adjacent to the clock driver block CLD in the first direction D1. The first slave latch block SLL1 may be adjacent to the clock driver block CLD in the second direction D2. The clock driver block CLD may include a portion of the second power line M1_R2 and a portion of the third power line M1_R3.

The clock driver block CLD may have an eighth border BD8 and a ninth border BD9. The eighth border BD8 and the ninth border BD9 may be opposite to each other in the first direction D1. The eighth border BD8 and the ninth border BD9 may extend in the second direction D2. The eighth border BD8 may be aligned with the first sidewall SW3 of the second power line M1_R2, and the ninth border BD9 may be aligned with the second sidewall SW4 of the third power line M1_R3. The clock driver block CLD may have a rectangular shape and may form a continuously-bounded area of the flip flop circuit from a plan view.

The second slave latch block SLL2 may be provided on the second active region CAR2. The scan MUX block SCM may be adjacent to the second slave latch block SLL2 in the first direction D1. The clock driver block CLD may be adjacent to the second slave latch block SLL2 in the second direction D2. The clock driver block CLD may be interposed between the first slave latch block SLL1 and the second slave latch block SLL2. The first slave latch block SLL1 may be spaced apart from the second slave latch block SLL2 in the second direction D2. The second slave latch block SLL2 may include a portion of the second power line M1_R2 and a portion of the third power line M1_R3.

The second slave latch block SLL2 may have a tenth border BD10 and an eleventh border BD11. The tenth border BD10 and the eleventh border BD11 may be opposite to each other in the first direction D1. The tenth border BD10 and the eleventh border BD11 may extend in the second direction D2. The tenth border BD10 may be aligned with the first sidewall SW3 of the second power line M1_R2, and the eleventh border BD11 may be aligned with the second sidewall SW4 of the third power line M1_R3. The second slave latch block SLL2 may have a rectangular shape and may form a continuously-bounded area of the flip flop circuit from a plan view.

The output block OUT may be provided on the second active region CAR2. The scan MUX block SCM may be adjacent to the output block OUT in the first direction D1. The second slave latch block SLL2 may be adjacent to the output block OUT in the second direction D2. The slave latch circuit SLL and the output circuit OUT may be arranged at the same plan height as each other below the plan height of the scan MUX circuit SCM and the master latch circuit MAL and may be arranged adjacent with respect to each other along the plan length direction. The scan MUX circuit, the master latch circuit, the slave latch circuit, the clock driver circuit, and the output circuit may be arranged within a rectangular area from the plan view, as shown, for example, in FIG. 5. The output block OUT may include a portion of the second power line M1_R2 and a portion of the third power line M1_R3.

The output block OUT may have a twelfth border BD12 and a thirteenth border BD13. The twelfth border BD12 and the thirteenth border BD13 may be opposite to each other in the first direction D1. The twelfth border BD12 and the thirteenth border BD13 may extend in the second direction D2. The twelfth border BD12 may be aligned with the first sidewall SW3 of the second power line M1_R2, and the thirteenth border BD13 may be aligned with the second sidewall SW4 of the third power line M1_R3. The output block OUT may have a rectangular shape.

In a third overlap region OR3, the output block OUT and the second slave latch block SLL2 overlap with each other. The third overlap region OR3 may extend in the first direction D1. The third overlap region OR3 may have a third width W3 in the second direction D2. The third width W3 may be smaller than the second width W2. The third width W3 may be substantially equal to the fourth width W4.

The output block OUT and the second slave latch block SLL2 may share the second active region CAR2 through the third overlap region OR3. The second active region CAR2, which is shared by the output block OUT and the second slave latch block SLL2, may be a region, to which the second power line M1_R2 and the third power line M1_R3 are electrically connected. In addition, as described further below in connection with FIG. 6B for example, the third overlap region OR3 may include a first active device, such as a transistor, that is part of the sub-circuit that forms the output circuit OUT and is also part of the sub-circuit that forms the slave latch circuit SLL. The transistor may include a source/drain region that is shared by the output circuit OUT and the slave latch circuit SLL.

Accordingly, as can be seen from the example embodiment of FIG. 5, at least a first sub-circuit, such as an output circuit OUT or scan MUX circuit SCM, and a second sub-circuit, such as a slave latch circuit SLL overlap from the plan view in a first overlap region (e.g., OR3 or OR1). Note that terms such as "first," "second," "third," etc., may be used herein as a naming convention and may be used differently to describe different portions of circuits and devices based on the context of the discussion. For example, the first overlap region (e.g., OR3 or OR1) includes part of a first continuously-bounded area (e.g., output block OUT or scan MUX block SCM) for the first sub-circuit and part of a second continuously-bounded area (e.g., second slave latch block SLL2) for the second sub-circuit. The second sub-circuit (e.g., slave latch circuit SLL) includes a third continuously-bounded area (e.g., first slave latch block SLL1). A first set of the plurality of active devices which together output a resulting signal for the second sub-circuit (e.g., for the slave latch circuit SLL) is located in the second continuously-bounded area (e.g., second slave latch block SLL2), and the remainder of the plurality of active devices which together output a resulting signal for the second sub-circuit are located in the third continuously-bounded area (e.g., first slave latch block SLL1). In addition, at least part of a third sub-circuit of the flip flop circuit (e.g., clock driver circuit CLD) is located in a fourth continuously-bounded area (e.g., clock driver block CLD) between the second continuously-bounded area and the third continuously-bounded area.

In a first overlap region OR1, the scan MUX block SCM overlaps with the clock driver block CLD, the second slave latch block SLL2, and the output block OUT. The first overlap region OR1 may extend in the second direction D2. The first overlap region OR1 may be extended from the output block OUT to the clock driver block CLD in the second direction D2. The first overlap region OR1 may substantially overlap with the second power line M1_R2. The first overlap region OR1 may have a first width W1 in the first direction D1. The first width W1 may be substantially equal to the second width W2.

The scan MUX block SCM, along with the clock driver block CLD, the second slave latch block SLL2, and the output block OUT, may share the second power line M1_R2 through the first overlap region OR1. As shown, a first part of the scan MUX circuit SCM in an overlap region (e.g., OR1) overlaps and is shared with a first part of the clock driver circuit CLD in the first overlap region, and a second part of the scan MUX circuit SCM is adjacent to a second part of the clock driver circuit (CLD) in a plan height direction without overlapping.

FIGS. 6A to 6D are sectional views taken along lines A-A', B-B', C-C', and D-D', respectively, of FIG. 3. The semiconductor device shown in FIGS. 3 and 6A to 6D may be an example of the flip-flop circuit (e.g., described with reference to FIGS. 1 to 5), which is actually implemented on a substrate.

Referring to FIGS. 3, 4, 5 and 6A to 6D, the first flip-flop cell FF1 may be provided on the substrate 100. Logic transistors constituting a logic circuit may be disposed on the first flip-flop cell FF1.

The substrate 100 may include the PMOSFET regions PR and the NMOSFET regions NR. The substrate 100 may be a semiconductor substrate including silicon, germanium, silicon-germanium, or the like or a compound semiconductor substrate. For example, the substrate 100 may be a silicon wafer.

The PMOSFET region PR and the NMOSFET region NR may constitute the first active region CAR1. The PMOSFET region PR of the first active region CAR1 may be adjacent to the NMOSFET region NR in the first direction D1. The PMOSFET region PR and the NMOSFET region NR may constitute the second active region CAR2. The NMOSFET region NR of the second active region CAR2 may be adjacent to the PMOSFET region PR in the first direction D1. Each PMOSFET region PR and NMOSFET region NR may be described as an active region.

The PMOSFET region PR and the NMOSFET region NR may be defined by a second trench TR2, which is formed in an upper portion of the substrate 100. The second trench TR2 may be positioned between the PMOSFET region PR and the NMOSFET region NR. The PMOSFET region PR and the NMOSFET region NR may be spaced apart from each other, in the first direction D1, with the second trench TR2 interposed therebetween. Each of the PMOSFET region PR and the NMOSFET region NR may extend in the second direction D2 crossing the first direction D1.

First active patterns AP1 and second active patterns AP2 may be provided on the PMOSFET region PR and the NMOSFET region NR, respectively. The first and second active patterns AP1 and AP2 may extend in the second direction D2 and may be parallel to each other. The first and second active patterns AP1 and AP2 may vertically protrude from a surface of the substrate 100, and may be part of the substrate (e.g., formed in an etching process), or may be epitaxially grown from the substrate. A first trench TR1 may be disposed between adjacent ones of the first active patterns AP1 and between adjacent ones of the second active patterns AP2. The first trench TR1 may be shallower than the second trench TR2.

A device isolation layer ST may fill the first and second trenches TR1 and TR2. The device isolation layer ST may be formed of or include silicon oxide. Upper portions of the first and second active patterns AP1 and AP2 may protrude vertically above the device isolation layer ST (e.g., see FIG. 6D). Each of the upper portions of the first and second active patterns AP1 and AP2 may be shaped like a fin. The device isolation layer ST may not cover the upper portions of the first and second active patterns AP1 and AP2. The device isolation layer ST may cover lower sidewalls of the first and second active patterns AP1 and AP2.

First source/drain patterns SD1 may be provided on the upper portions of the first active patterns AP1. The first source/drain patterns SD1 may be impurity regions of a first conductivity type (e.g., p-type). A first channel pattern CH1 may be interposed between a pair of the first source/drain patterns SD1. Second source/drain patterns SD2 may be provided on the upper portions of the second active patterns AP2. The second source/drain patterns SD2 may be impurity regions of a second conductivity type (e.g., n-type). A second channel pattern CH2 may be interposed between a pair of the second source/drain patterns SD2.

The first and second source/drain patterns SD1 and SD2 may be epitaxial patterns, which are formed by a selective epitaxial growth process. As an example, the first and second source/drain patterns SD1 and SD2 may have top surfaces that are coplanar with top surfaces of the first and second channel patterns CH1 and CH2. As another example, the top surfaces of the first and second source/drain patterns SD1 and SD2 may be higher than the top surfaces of the first and second channel patterns CH1 and CH2.

The first source/drain patterns SD1 may include a semiconductor element (e.g., SiGe), whose lattice constant is larger than a lattice constant of a semiconductor element in the substrate 100. Accordingly, the first source/drain patterns SD1 may exert a compressive stress on the first channel patterns CH1. As an example, the second source/drain patterns SD2 may include the semiconductor element (e.g., Si) as the substrate 100.

A width, in the second direction D2, of the upper portion of each of the first and second source/drain patterns SD1 and SD2 may be the third width W3. The width of the upper portion of each of the first and second source/drain patterns SD1 and SD2 may be substantially equal to the third width W3 of the third overlap region OR3. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

Gate electrodes GE may be provided to cross the first and second active patterns AP1 and AP2 and extend in the first direction D1. The gate electrodes GE may be arranged in the second direction D2. The gate electrodes GE may overlap with the first and second channel patterns CH1 and CH2 when viewed in a plan view. Each of the gate electrodes GE may enclose a top surface and opposite side surfaces of each of the first and second channel patterns CH1 and CH2.

Figure 6A:
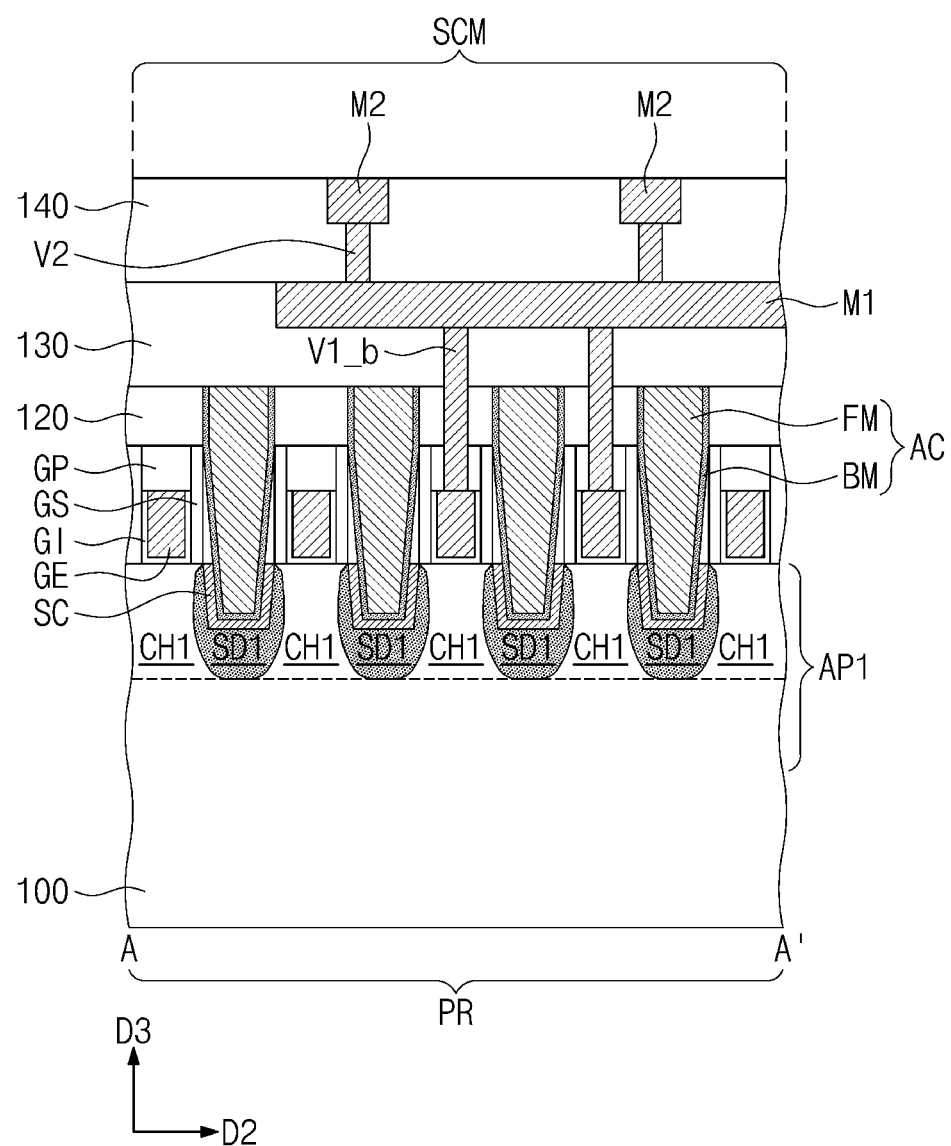
FIGS. 6A to 6D are sectional views taken along lines A-A', B-B', C-C', and D-D', respectively, of FIG. 3.
Figure 6B:
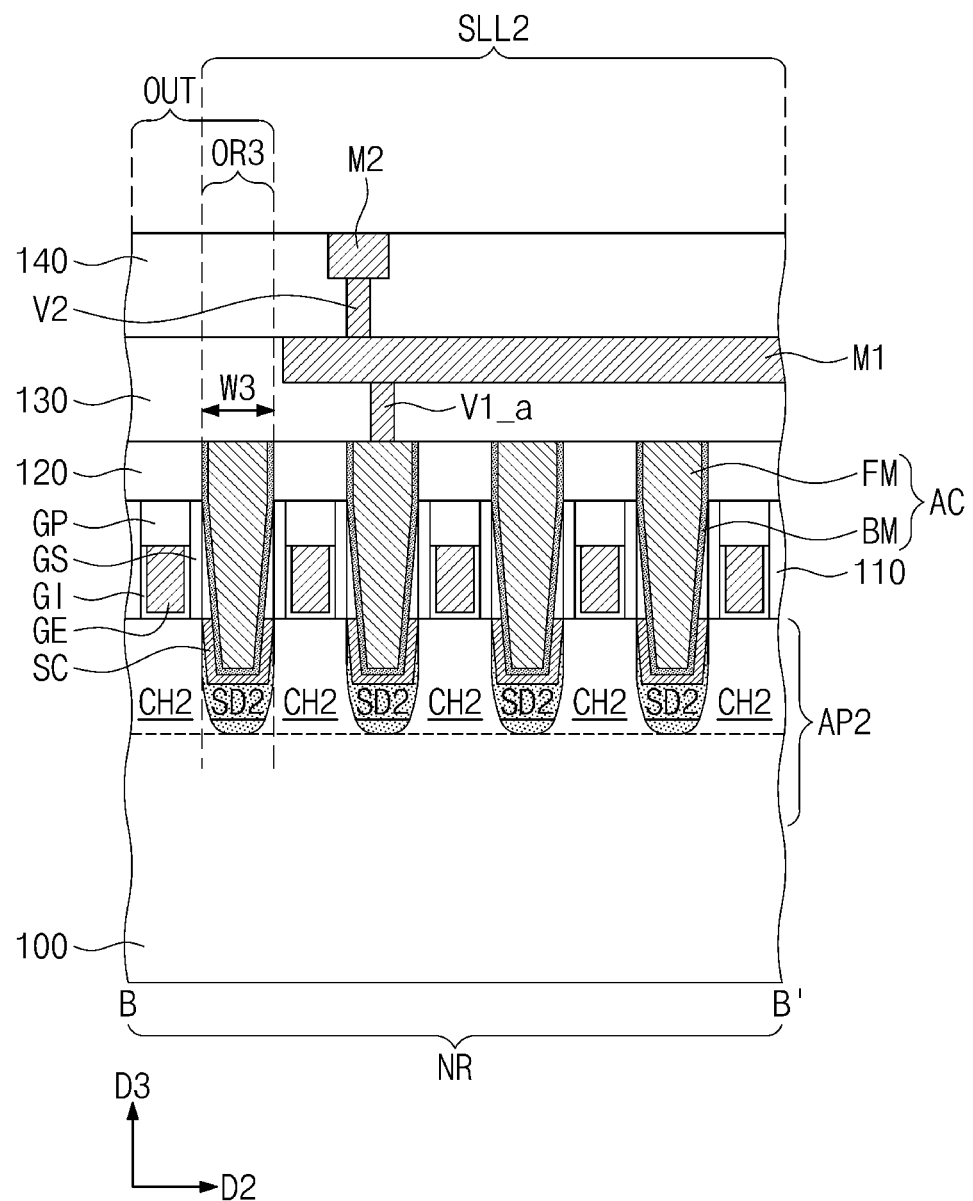
Figure 6C:
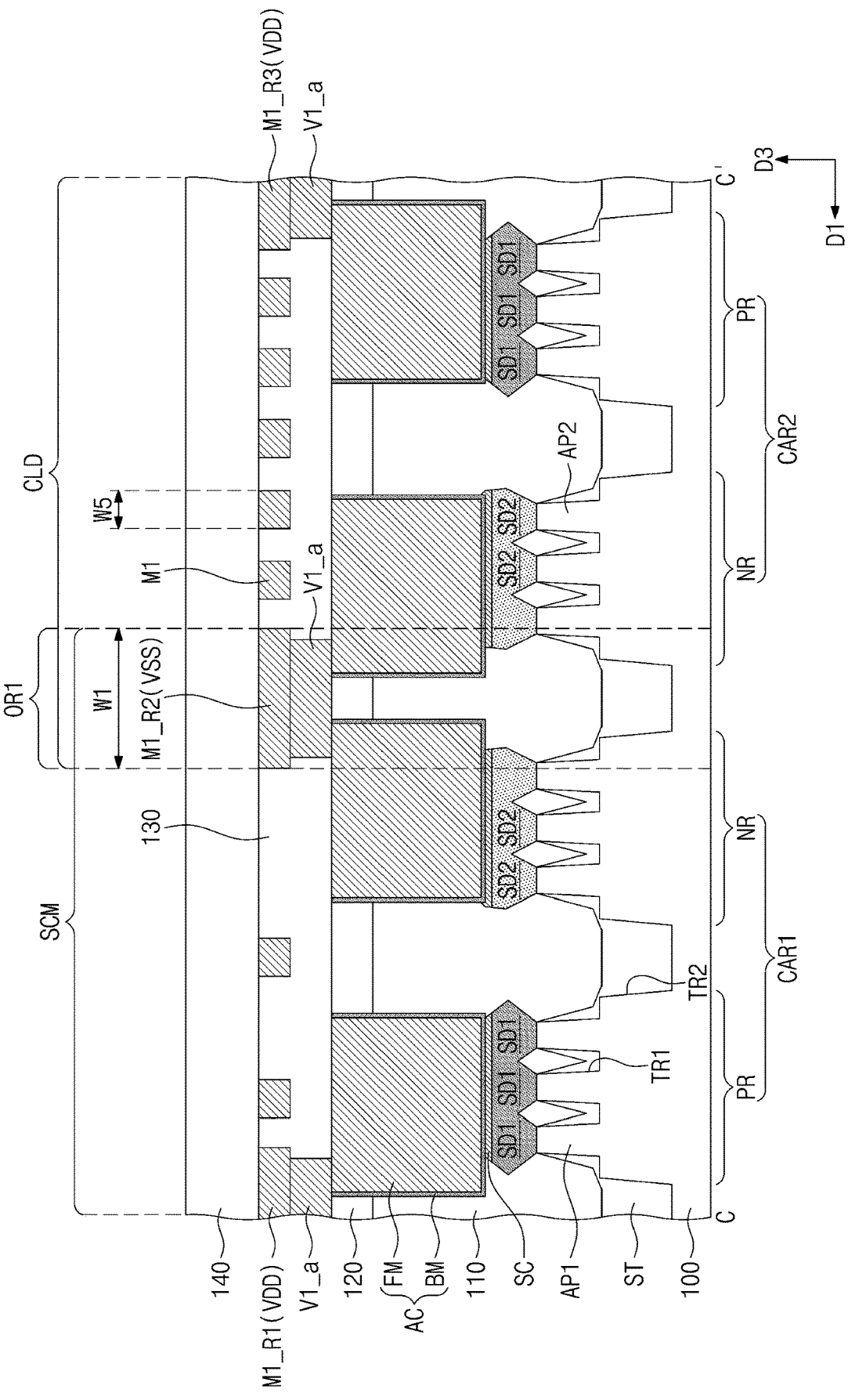
Figure 6D:
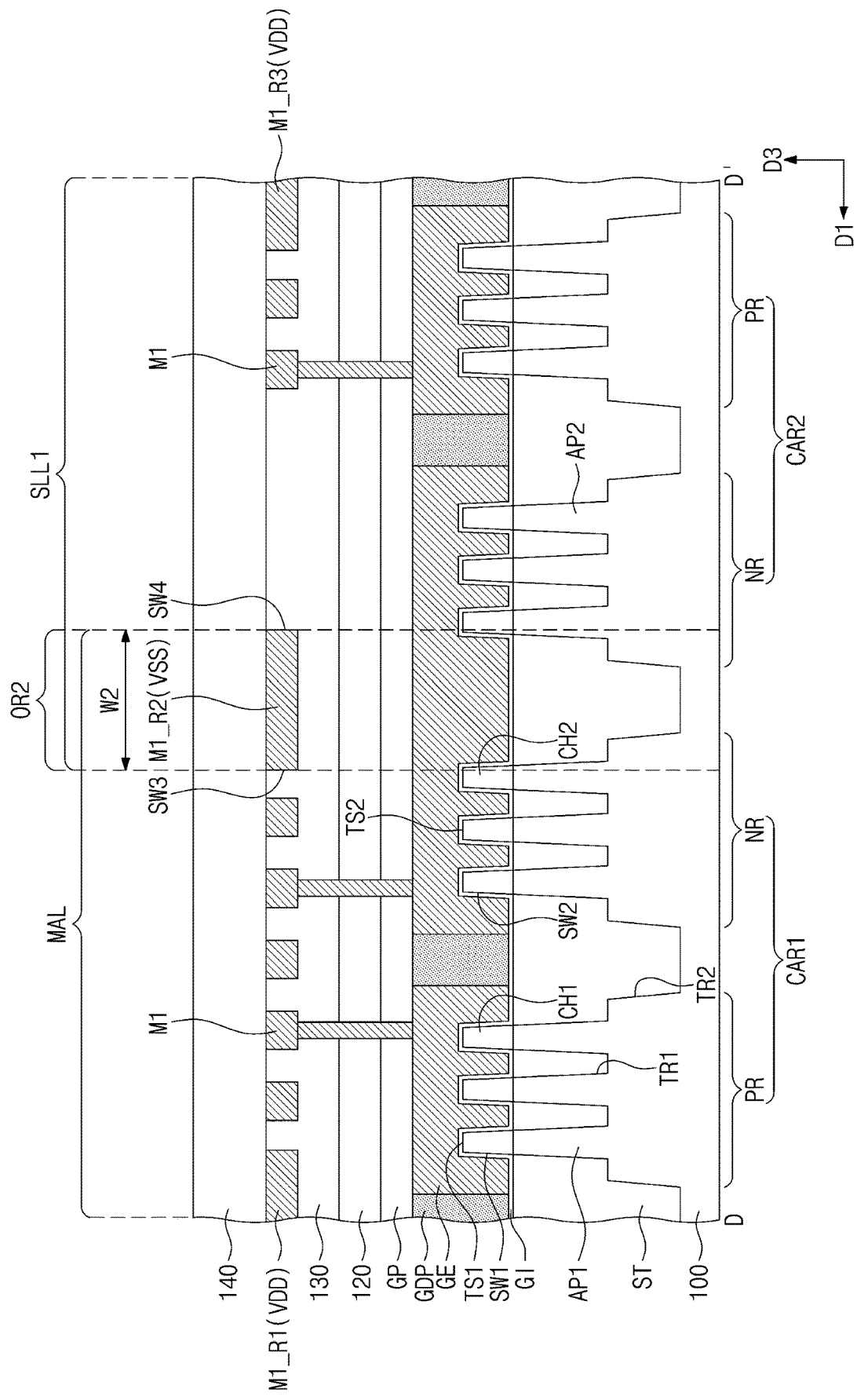

Referring back to FIG. 6D, a first gate electrode GE may be provided on a first top surface TS1 of the first channel pattern CH1 and at least one of the first sidewalls SW1 of the first channel pattern CH1. A second gate electrode GE may be provided on a second top surface TS2 of the second channel pattern CH2 and on at least one of the second sidewalls SW2 of the second channel pattern CH2. For example, the transistor according to the present embodiment may be a three-dimensional field effect transistor (e.g., FinFET), in which a gate electrode GE is disposed to three-dimensionally surround the channel patterns CH1 and CH2. It some embodiments, as shown in FIG. 6D, one gate electrode GE crosses over an overlap region (e.g., OR2) and two of the active regions separated by the overlap region.

Referring back to FIGS. 3, 4, 5 and 6A to 6D, a pair of gate spacers GS may be disposed on opposite side surfaces of each of the gate electrodes GE. The gate spacers GS may extend along the gate electrodes GE and in the first direction D1. Top surfaces of the gate spacers GS may be higher than top surfaces of the gate electrodes GE. The top surfaces of the gate spacers GS may be coplanar with a top surface of a first interlayered insulating layer 110, which will be described below. The gate spacers GS may be formed of or include at least one of SiCN, SiCON, or SiN. In an embodiment, the gate spacers GS may be a multi-layered structure, which includes at least two different materials selected from SiCN, SiCON, and SiN.

The gate electrode GE may be divided into a plurality of the gate electrodes GE by a gate separation pattern GDP. For example, the gate separation pattern GDP may divide the gate electrode GE extending in the first direction D1 into two gate electrodes GE, which are arranged in the first direction D1. The gate separation pattern GDP may include an insulating material (e.g., at least one of SiO, SiON, SiCN, SiCON, or SiN).

A gate capping pattern GP may be provided on each of the gate electrodes GE. The gate capping pattern GP may extend along the gate electrode GE and in the first direction D1. The gate capping pattern GP may be formed of or include at least one of materials, which have etch selectivity with respect to first and second interlayered insulating layers 110 and 120 to be described below. In detail, the gate capping patterns GP may be formed of or include at least one of SiON, SiCN, SiCON, or SiN.

A gate dielectric pattern GI may be interposed between the gate electrode GE and the first active pattern AP1 and between the gate electrode GE and the second active pattern AP2. The gate dielectric pattern GI may extend along a bottom surface of the gate electrode GE thereon. As an example, the gate dielectric pattern GI may cover the first top surface TS1 and the first sidewalls SW1 of the first channel pattern CH1. The gate dielectric pattern GI may cover the second top surface TS2 and the two opposite second sidewalls SW2 of the second channel pattern CH2. The gate dielectric pattern GI may cover a top surface of the device isolation layer ST below the gate electrode GE (e.g., see FIG. 6D).

In an embodiment, the gate dielectric pattern GI may be formed of or include a high-k dielectric material, whose dielectric constant is higher than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate electrode GE may include a first metal pattern and a second metal pattern on the first metal pattern. The first metal pattern may be provided on the gate dielectric pattern GI and may be adjacent to the first and second channel patterns CH1 and CH2. The first metal pattern may include a work function metal, which can be used to adjust a threshold voltage of the transistor. By adjusting a thickness and composition of the first metal pattern, it may be possible to realize a transistor having a desired threshold voltage.

The first metal pattern may include a metal nitride layer. For example, the first metal pattern may include at least one metal, which is selected from the group consisting of titanium (Ti), tantalum (Ta), aluminum (Al), tungsten (W) and molybdenum (Mo), and nitrogen (N). The first metal pattern may further include carbon (C). The first metal pattern may include a plurality of work function metal layers, which are stacked.

The second metal pattern may include a metallic material, whose resistance is lower than the first metal pattern. For example, the second metal pattern may include at least one metal selected from the group consisting of tungsten (W), aluminum (Al), titanium (Ti), and tantalum (Ta).

The first interlayered insulating layer 110 may be provided on the substrate 100. The first interlayered insulating layer 110 may cover the gate spacers GS and the first and second source/drain patterns SD1 and SD2. A top surface of the first interlayered insulating layer 110 may be substantially coplanar with top surfaces of the gate capping patterns GP and the top surfaces of the gate spacers GS. A second interlayered insulating layer 120 may be provided on the first interlayered insulating layer 110 to cover the gate capping patterns GP. A third interlayered insulating layer 130 may be provided on the second interlayered insulating layer 120. A fourth interlayered insulating layer 140 may be provided on the third interlayered insulating layer 130. In an embodiment, the first to fourth interlayered insulating layers 110-140 may be formed of or include silicon oxide.

Active contacts AC may be provided to penetrate the first and second interlayered insulating layers 110 and 120 and may be electrically connected to the first and second source/drain patterns SD1 and SD2, respectively. Each of the active contacts AC may be provided between a pair of the gate electrodes GE.

The active contact AC may be a self-aligned contact. For example, the active contact AC may be formed by a self-alignment process using the gate capping pattern GP and the gate spacer GS. For example, the active contact AC may cover at least a portion of a side surface of the gate spacer GS. Although not shown, in certain embodiments, the active contact AC may cover a portion of the top surface of the gate capping pattern GP.

A silicide pattern SC may be interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or include at least one of metal-silicide materials (e.g., titanium-silicide, tantalum-silicide, tungsten-silicide, nickel-silicide, and cobalt-silicide).

The active contact AC may include a conductive pattern FM and a barrier pattern BM surrounding the conductive pattern FM. For example, the conductive pattern FM may be formed of or include at least one metal of aluminum, copper, tungsten, molybdenum, or cobalt. The barrier pattern BM may cover side and bottom surfaces of the conductive pattern FM. The barrier pattern BM may include at least one of a metal layer or a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

The largest width of the active contact AC on the third overlap region OR3 may be substantially equal to the third width W3. In detail, an upper portion of the active contact AC on the third overlap region OR3 may have the third width W3. The width of the active contact AC on the third overlap region OR3 may gradually decrease in a downward direction from top to bottom.

The first metal layer, which is composed of the first interconnection lines M1 may be provided in the third interlayered insulating layer 130. The first interconnection lines M1 may extend in the second direction D2 and may be parallel to each other. Each of the first interconnection lines M1 may be a line or bar-shape pattern extending in the second direction D2.

The first interconnection lines M1 may include the first to third power lines M1_R1, M1_R2, and M1_R3. A width of each of the first to third power lines M1_R1, M1_R2, and M1_R3 in the first direction D1 may be the first width W1 or the second width W2. In other words, the width of each of the first to third power lines M1_R1, M1_R2, and M1_R3 may be substantially equal to the first width W1 of the first overlap region OR1. The width of each of the first to third power lines M1_R1, M1_R2, and M1_R3 may be substantially equal to the second width W2 of the second overlap region OR2.

First lower vias V1_a may be respectively interposed between the first interconnection lines M1 and the active contacts AC to electrically connect them to each other. Second lower vias V1_b may be respectively interposed between the first interconnection lines M1 and the gate electrodes GE to electrically connect them to each other.

As can be seen from FIG. 6C, in some embodiments, a shared conductive via (e.g., V1_a) contacts and electrically connects to a first interconnection line, such as a power line (e.g., M1_R2 (VSS)), and is disposed below the first power line. A first active contact (e.g., AC) is connected to the shared conductive via and a source/drain pattern (e.g., one of the SD2 source/drain patterns) of a first sub-circuit (e.g., scan MUX circuit SCM). A second active contact (e.g., AC) is connected to the shared conductive via and a source/drain pattern (e.g., the other of the SD2 source/drain patterns) of the second source sub-circuit (e.g., clock driver circuit CLD). As shown in FIG. 6C, the overlap region (e.g., OR1) is horizontally between the source/drain pattern of the first sub-circuit and the source/drain pattern of the second sub-circuit in a plan view. In addition, the source/drain pattern (e.g., SD2) of the first sub-circuit (e.g., scan MUX circuit SCM) is in the continuously-bounded area for the first sub-circuit and is outside the overlap region, and the source/drain pattern (e.g., SD2) of the second sub-circuit (e.g., clock delay circuit CLD) is in the continuously-bounded area for the second sub-circuit and is outside the overlap region. As can be seen, the first active contact is horizontally separated from the second active contact.

As can also be seen in FIG. 6C, a plurality of adjacent active regions (e.g., PR of CAR1, NR of CAR1, NR of CAR2, and PR of CAR2) are arranged in a first direction on the substrate, and a plurality of adjacent active contacts (e.g., AC) are respectively formed on and electrically connected to the plurality of adjacent active regions, each adjacent active contact being separated from a next adjacent active contact by a separation distance in the first direction D1. In one embodiment, as shown in FIG. 6C, a separation distance in the overlap region (e.g., OR1 in FIG. 6C) between adjacent active contacts is smaller than a separation distance outside of the overlap region between adjacent active contacts. As shown in FIG. 6C, the adjacent active regions are fin-type active regions. However, in some embodiments, the adjacent active regions may be, for example, gate-all-around type active regions.

Each of the first to third power lines M1_R1, M1_R2, and M1_R3 may be connected in common to the active contacts AC, which are adjacent to each other in the first direction D1. For example, referring back to FIG. 6C, the second power line M1_R2 may be connected in common to the active contact AC on the NMOSFET region NR of the first active region CAR1 and to the active contact AC on the NMOSFET region NR of the second active region CAR2 through the first lower via V1_a.

Each of the first interconnection lines M1 on the first and second active regions CAR1 and CAR2 may have a fifth width W5 in the first direction D1. The first width W1 of each of the first to third power lines M1_R1, M1_R2, and M1_R3 may be 1.5 to 5 times larger than the fifth width W5.

The second metal layer, which is composed of the second interconnection lines M2, may be provided in the fourth interlayered insulating layer 140. The second interconnection lines M2 may extend in the first direction D1 and may be parallel to each other. Each of the second interconnection lines M2 may be a line or bar-shape pattern extending in the first direction D1. Second vias V2 may be respectively interposed between the second interconnection lines M2 and the first interconnection lines M1 and may electrically connect the first and second interconnection lines M1 and M2 to each other.

In an embodiment, the first interconnection lines M1, the first and second lower vias V1_a and V1_b, the second interconnection lines M2, and the second vias V2 may include and may be formed of the same conductive material. For example, the first interconnection lines M1, the first and second lower vias V1_a and V1_b, the second interconnection lines M2, and the second vias V2 may be formed of or include at least one metallic material selected from aluminum, copper, tungsten, molybdenum, and cobalt. Although not shown, a plurality of stacked metal layers may be further disposed on the fourth interlayered insulating layer 140. Each of the stacked metal layers may include routing lines.

FIGS. 7A to 7D are sectional views, which are respectively taken along lines A-A', B-B', C-C', and D-D' of FIG. 3 to illustrate a semiconductor device according to an embodiment of the inventive concept. In the following description, an element previously described with reference to FIGS. 3, 4, 5 and 6A to 6D may be identified by the same reference number without repeating an overlapping description thereof.

Referring to FIGS. 3, 4, 5 and 7A to 7D, the first flip-flop cell FF1 may be provided on the substrate 100. The substrate 100 may include the first active region CAR1 and the second active region CAR2. Each of the first and second active regions CAR1 and CAR2 may include the PMOSFET region PR and the NMOSFET region NR.

The device isolation layer ST may be provided on the substrate 100. The device isolation layer ST may define the first active pattern AP1 and the second active pattern AP2 in an upper portion of the substrate 100. The first active pattern AP1 and the second active pattern AP2 may be defined on the PMOSFET region PR and the NMOSFET region NR, respectively.

The first active pattern AP1 may include the first channel patterns CH1, which are vertically stacked. The stacked first channel patterns CH1 may be spaced apart from each other in a third direction D3. The stacked first channel patterns CH1 may be overlapped with each other, when viewed in a plan view. The second active pattern AP2 may include the second channel patterns CH2, which are vertically stacked. The stacked second channel patterns CH2 may be spaced apart from each other in the third direction D3. The stacked second channel patterns CH2 may be overlapped with each other, when viewed in a plan view. The first and second channel patterns CH1 and CH2 may be formed of or include at least one of silicon (Si), germanium (Ge), or silicon-germanium (SiGe).

The first active pattern AP1 may further include the first source/drain patterns SD1. The stacked first channel patterns CH1 may be interposed between each adjacent pair of the first source/drain patterns SD1. The stacked first channel patterns CH1 may connect the adjacent pair of the first source/drain patterns SD1 to each other.

The second active pattern AP2 may further include the second source/drain patterns SD2. The stacked second channel patterns CH2 may be interposed between each adjacent pair of the second source/drain patterns SD2. The stacked second channel patterns CH2 may connect the adjacent pair of the second source/drain patterns SD2 to each other.

The gate electrodes GE may be provided to cross the first and second channel patterns CH1 and CH2 and extend in the first direction D1. The gate electrode GE may overlap with the first and second channel patterns CH1 and CH2, when viewed in a plan view. A pair of the gate spacers GS may be disposed on opposite side surfaces of the gate electrode GE. The gate capping pattern GP may be provided on the gate electrode GE.

Figure 7A:
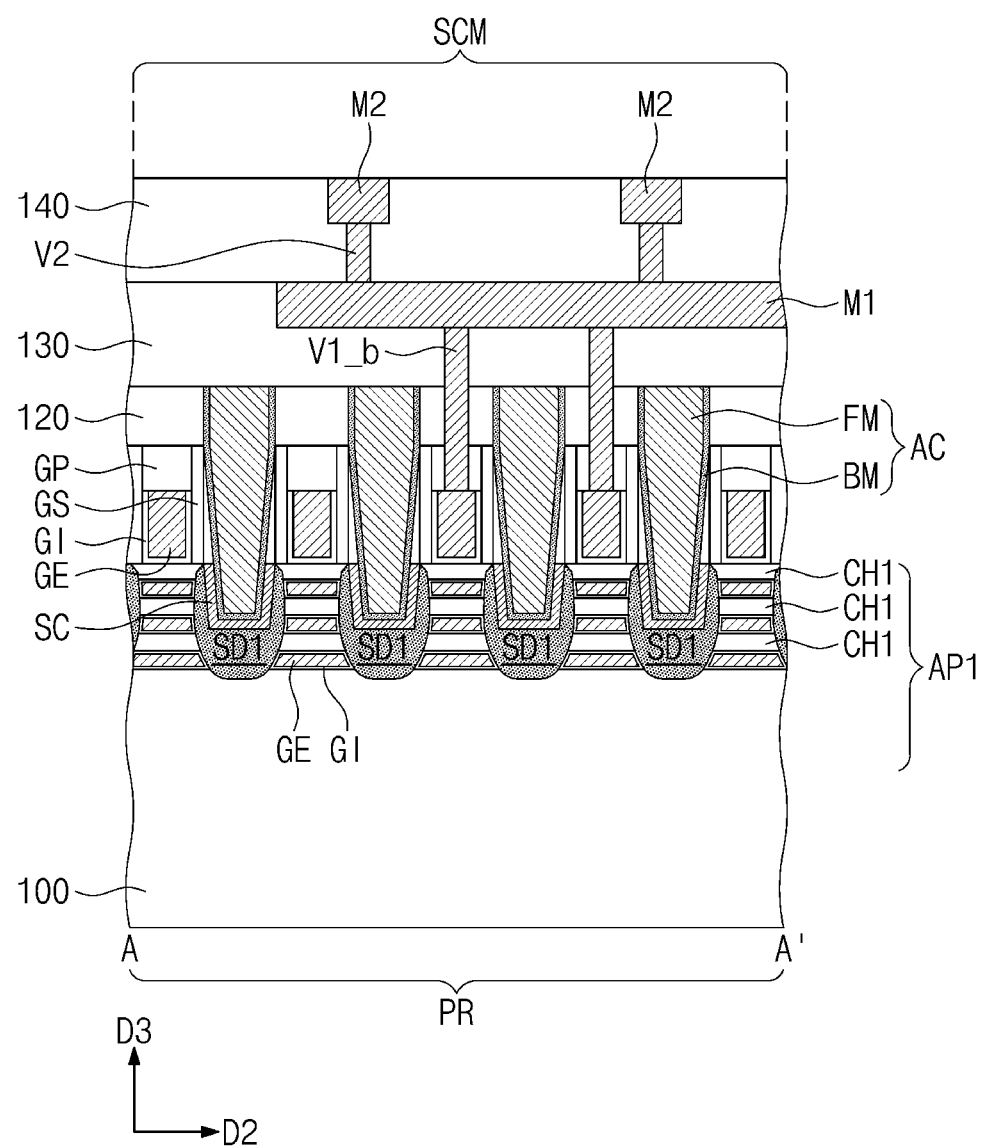
FIGS. 7A to 7D are sectional views, which are respectively taken along lines A-A', B-B', C-C', and D-D' of FIG. 3 to illustrate a semiconductor device according to an embodiment of the inventive concept.
Figure 7B:
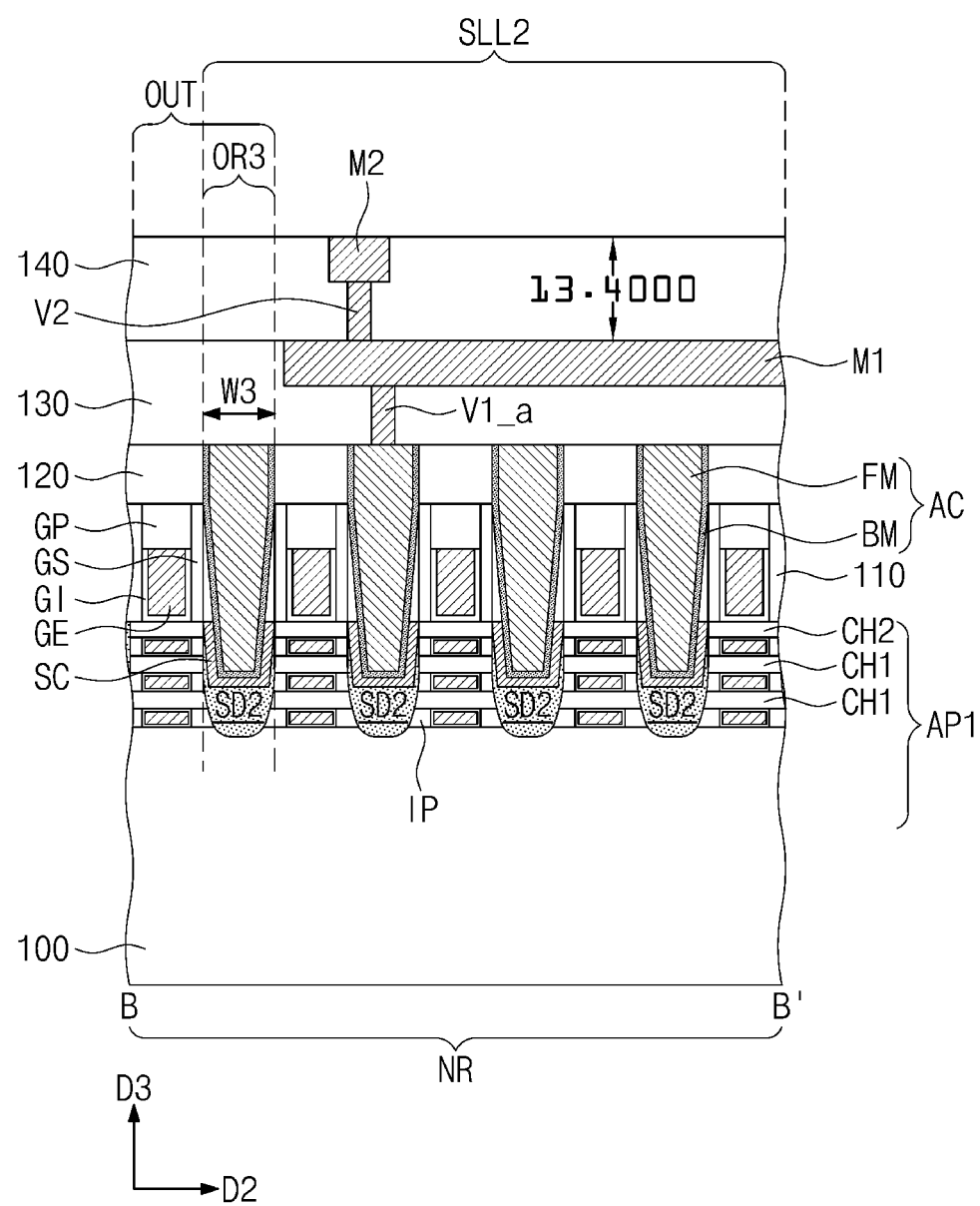
Figure 7C:
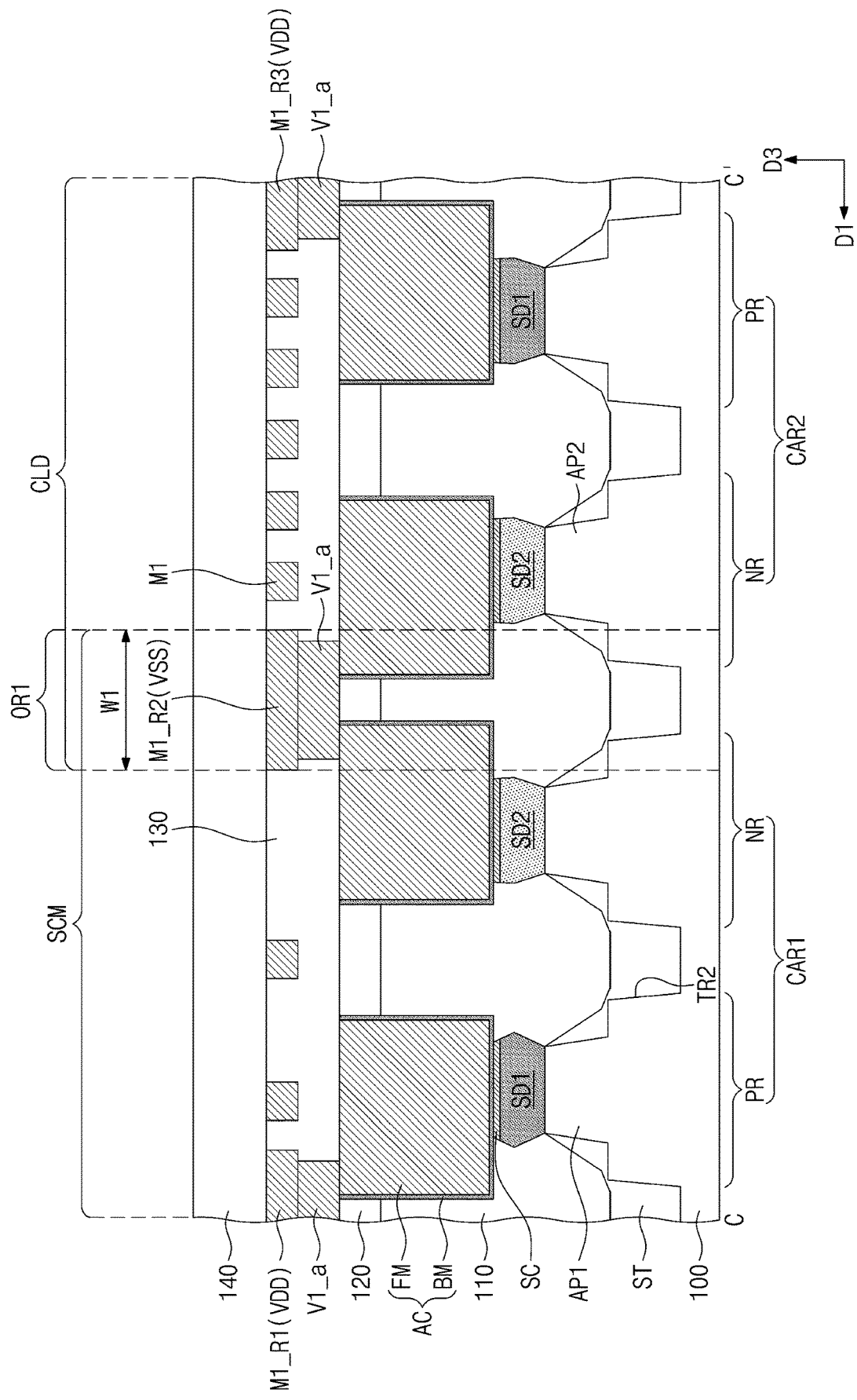
Figure 7D:
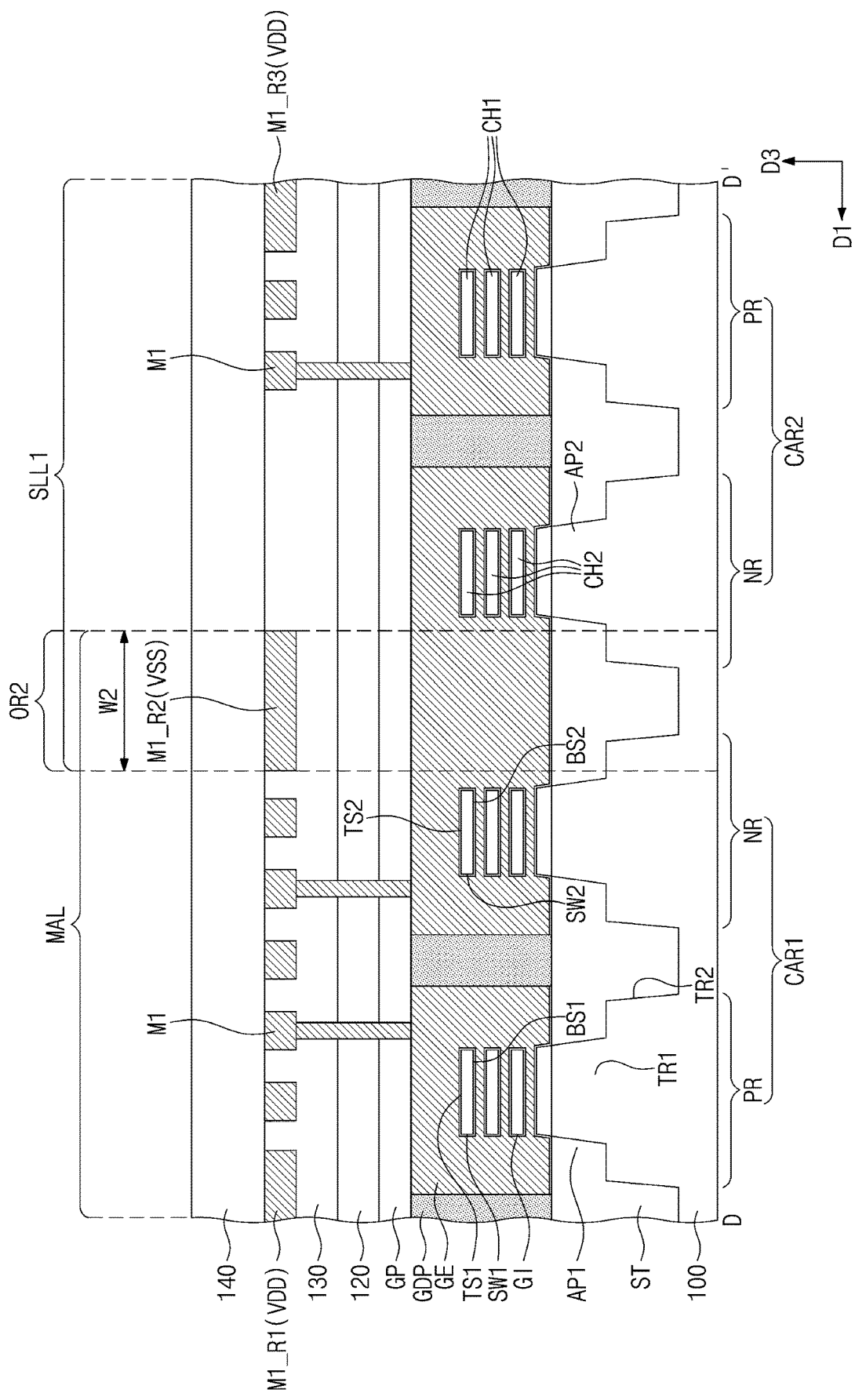

The gate electrode GE may surround each of the first and second channel patterns CH1 and CH2 (e.g., see FIG. 7D). The gate electrode GE may be provided on the first top surface TS1, at least one of the first sidewalls SW1, and a first bottom surface BS1 of the first channel pattern CH1. The gate electrode GE may be provided on the second top surface TS2, at least one of the second sidewalls SW2, and a second bottom surface BS2 of the second channel pattern CH2. In other words, the gate electrode GE may enclose top, bottom and opposite side surfaces of each of the first and second channel patterns CH1 and CH2. A transistor according to the present embodiment may be a three-dimensional field-effect transistor (e.g., multi-bridge channel field-effect transistor (MBCFET)), in which the gate electrode GE is provided to three-dimensionally surround the channel patterns CH1 and CH2.

The gate dielectric pattern GI may be provided between each of the first and second channel patterns CH1 and CH2 and the gate electrode GE. The gate dielectric pattern GI may surround each of the first and second channel patterns CH1 and CH2.

On the NMOSFET region NR, an insulating pattern IP may be interposed between the gate dielectric pattern GI and the second source/drain pattern SD2. The gate electrode GE may be spaced apart from the second source/drain pattern SD2 by the gate dielectric pattern GI and the insulating pattern IP. By contrast, on the PMOSFET region PR, the insulating pattern IP may be omitted.

The first interlayer insulating layer 110 and the second interlayer insulating layer 120 may be provided on the entire top surface of the substrate 100. The active contacts AC may be provided to penetrate the first and second interlayer insulating layers 110 and 120 and to be connected to the first and second source/drain patterns SD1 and SD2, respectively.

The third interlayer insulating layer 130 may be provided on the second interlayer insulating layer 120. The fourth interlayer insulating layer 140 may be provided on the third interlayer insulating layer 130. The first metal layer may be provided in the third interlayer insulating layer 130. The first metal layer may include the first interconnection lines M1, the first lower vias V1_a and the second lower vias V1_b. The second metal layer may be provided in the fourth interlayer insulating layer 140. The second metal layer may include the second interconnection lines M2 and the second vias V2.

FIG. 8 is a logic circuit diagram illustrating a flip-flop circuit of a semiconductor device according to an embodiment of the inventive concept. In the following description, an element previously described with reference to FIG. 2 may be identified by the same reference number without repeating an overlapping description thereof.

Referring to FIG. 8, the first flip-flop cell FF1 may include the scan MUX block SCM, the master latch block MAL, the slave latch block SLL, the clock driver block CLD, and the output block OUT. The slave latch block SLL of FIG. 8 may differ from the slave latch block SLL of FIG. 3 in that the NOR gate is replaced with an inverter. Except for this difference, the circuit diagram of the first flip-flop cell FF1 of FIG. 8 may be substantially the same as that of the first flip-flop cell FF1 of FIG. 3.

Figure 9:
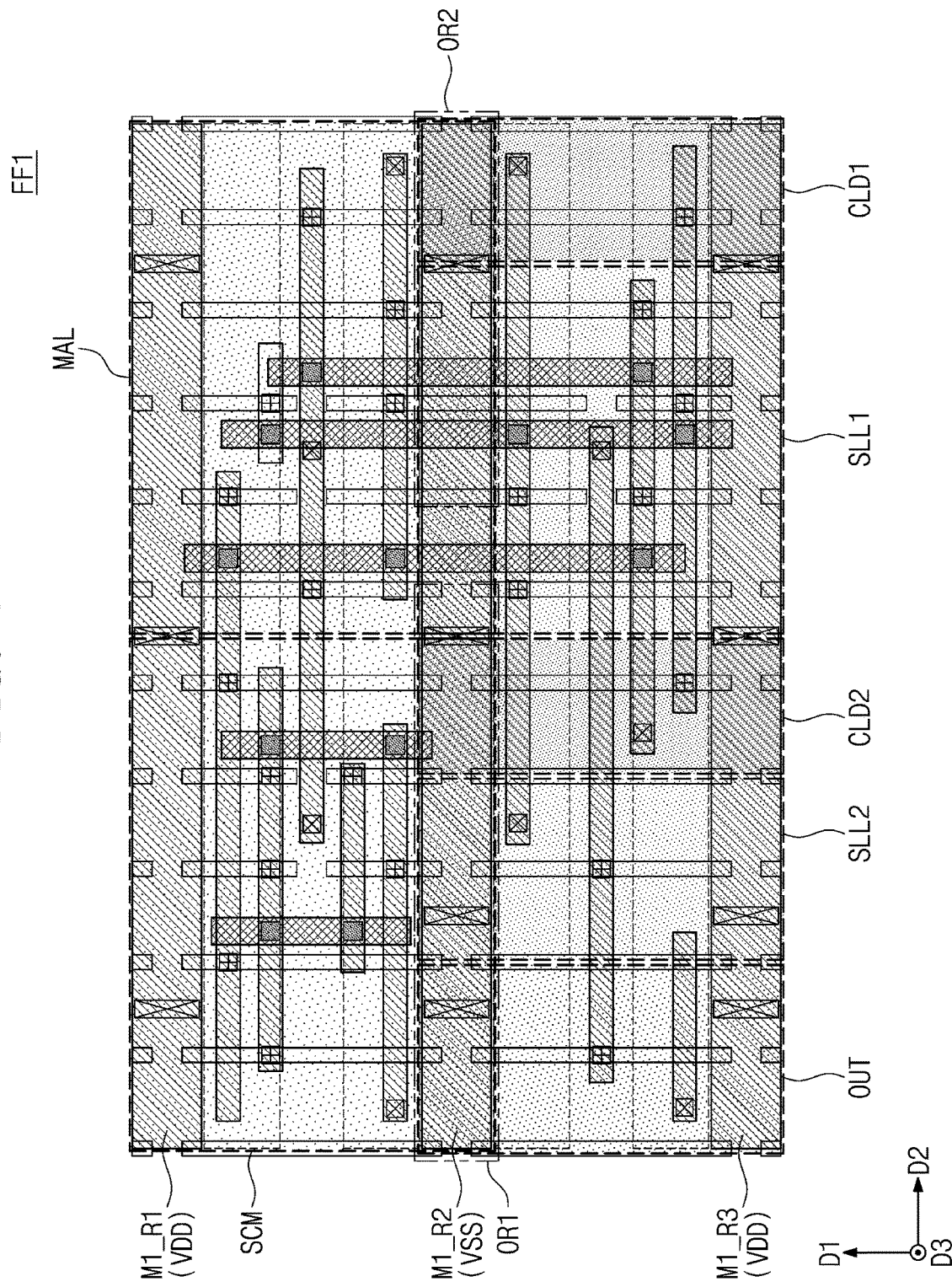
FIG. 9 is a plan view illustrating a plurality of blocks constituting a flip-flop cell of a semiconductor device according to an embodiment of the inventive concept.
Figure 10:
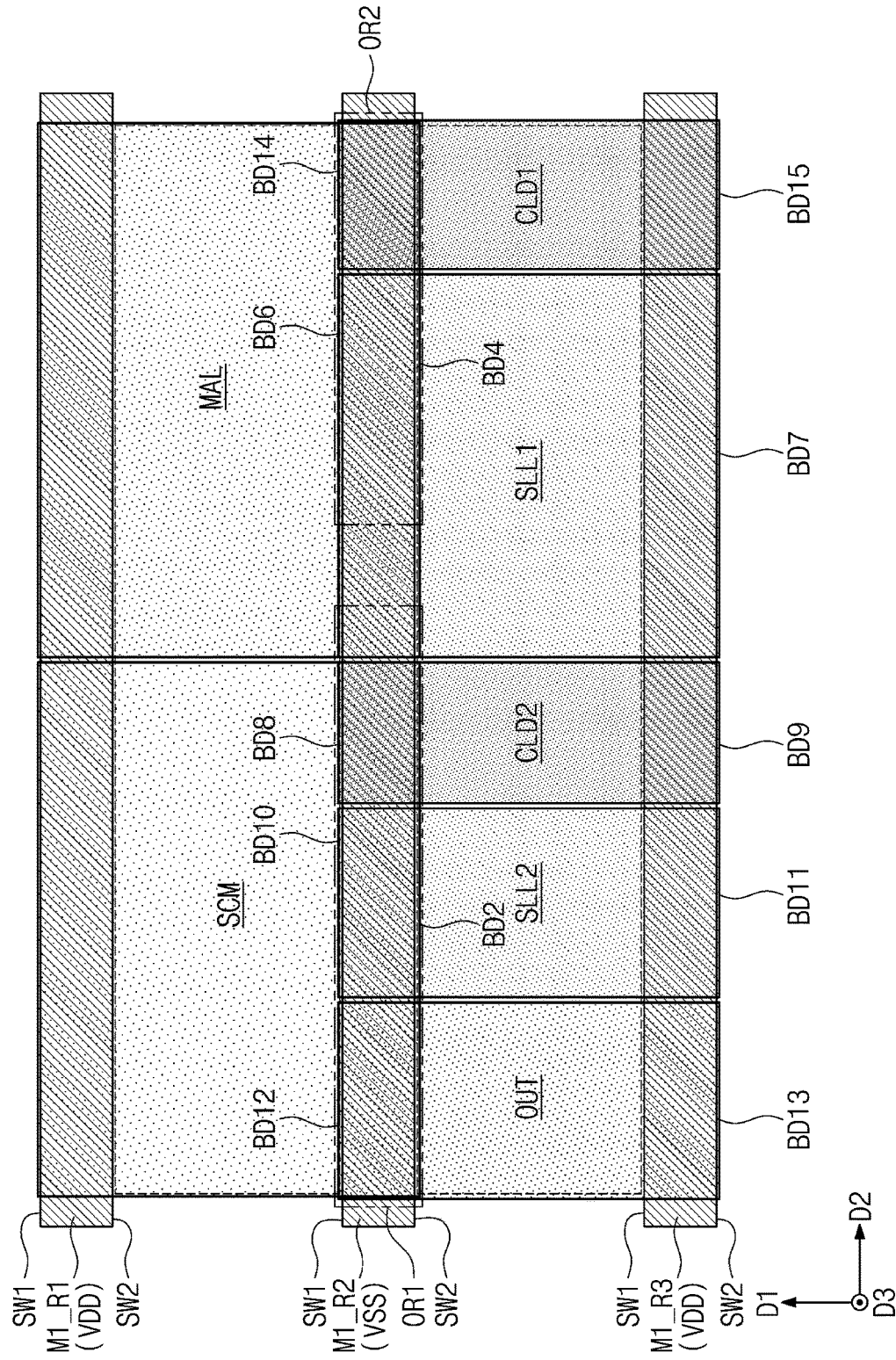
FIG. 10 is a plan view illustrating a plurality of blocks constituting the flip-flop cell of FIG. 9.

FIG. 9 is a plan view illustrating a plurality of blocks constituting a flip-flop cell of a semiconductor device according to an embodiment of the inventive concept. FIG. 10 is a plan view illustrating a plurality of blocks constituting the flip-flop cell of FIG. 9. In detail, FIG. 10 briefly illustrates only blocks constituting the flip-flop cell in the plan view of FIG. 9. In the following description, an element previously described with reference to FIGS. 1 to 5 may be identified by the same reference number without repeating an overlapping description thereof.

Referring to FIGS. 8 to 10, the first flip-flop cell FF1 may be provided on the substrate 100. The first flip-flop cell FF1 may include the scan MUX block SCM, the master latch block MAL, the first slave latch block SLL1, the second slave latch block SLL2, a first clock driver block CLD1, a second clock driver block CLD2, and the output block OUT. The first slave latch block SLL1 and the second slave latch block SLL2 may constitute the slave latch block (e.g., slave latch circuit) SLL of FIG. 8. The first clock driver block CLD1 and the second clock driver block CLD2 may constitute the clock driver block (e.g., clock driver circuit) CLD of FIG. 8.

In the present embodiment, each of the scan MUX block SCM, the master latch block MAL, the first slave latch block SLL1, the second slave latch block SLL2, the first clock driver block CLD1, the second clock driver block CLD2, and the output block OUT may have a rectangular shape. In addition, similar to FIGS. 1-5 and 6A-6D, these blocks comprise circuits, and so these blocks are also described herein as a scan MUX circuit SCM, a master latch circuit MAL, a slave latch circuit SLL, a clock driver circuit CLD, and an output circuit OUT. Each of these circuits may also be described as a sub-circuit, e.g., a sub-circuit of a flip-flop cell.

The scan MUX block SCM may be provided on the first active region CAR1. The master latch block MAL may be provided on the first active region CAR1. The master latch block MAL may not overlap with the second active region CAR2 and may be spaced apart from the second active region CAR2. The master latch block MAL may be adjacent to the scan MUX block SCM in the second direction D2.

The master latch block MAL may include a portion of the first power line M1_R1 and a portion of the second power line M1_R2. The master latch block MAL may not include a portion of the third power line M1_R3. For example, the master latch block MAL may not overlap with the third power line M1_R3 and may be spaced apart from the third power line M1_R3. The master latch block MAL according to the present embodiment may not include the second region RG2 previously described with reference to FIG. 5.

The master latch block MAL may have the third border BD3 and the fourth border BD4. The third border BD3 and the fourth border BD4 may be opposite to each other in the first direction D1. The third border BD3 and the fourth border BD4 may extend in the second direction D2. The third border BD3 may be aligned with the first sidewall SW3 of the first power line M1_R1, and the fourth border BD4 may be aligned with the second sidewall SW4 of the second power line M1_R2. The master latch block MAL may not have the fifth border BD5 previously described with reference to FIG. 5.

The first clock driver block CLD1 may be provided on the second active region CAR2. The master latch block MAL may be adjacent to the first clock driver block CLD1 in the first direction D1. The first clock driver block CLD1 may have a fourteenth border and a fifteenth border. The fourteenth border and the fifteenth border may extend in the second direction D2. The fourteenth border may be aligned with the first sidewall SW3 of the second power line M1_R2, and the fifteenth border may be aligned with the second sidewall SW4 of the third power line M1_R3.

The first slave latch block SLL1 may be provided on the second active region CAR2. The master latch block MAL may be adjacent to the first slave latch block SLL1 in the first direction D1.

In the second overlap region OR2, the master latch block MAL overlaps with the first clock driver block CLD1 and the first slave latch block SLL1. The second overlap region OR2 may extend in the second direction D2. The second overlap region OR2 may substantially overlap with the second power line M1_R2. The second overlap region OR2 may have the second width W2 in the first direction D1. The master latch block MAL, along with the first clock driver block CLD1 and the first slave latch block SLL1, may share the second power line M1_R2 through the second overlap region OR2.

The second clock driver block CLD2 is provided on the second active region CAR2. The scan MUX block SCM is adjacent to the second clock driver block CLD2 in the first direction D1. The first slave latch block SLL1 is adjacent to the second clock driver block CLD2 in the second direction D2.

The second slave latch block SLL2 is provided on the second active region CAR2. The second clock driver block CLD2 is adjacent to the second slave latch block SLL2 in the second direction D2. The second clock driver block CLD2 is interposed between the first slave latch block SLL1 and the second slave latch block SLL2.

The output block OUT is provided on the second active region CAR2. According to the present embodiment, the third overlap region OR3 of FIG. 5, in which the output block OUT and the second slave latch block SLL2 overlap with each other, may be omitted.

In the first overlap region OR1, the scan MUX block SCM overlaps with the second clock driver block CLD2, the second slave latch block SLL2, and the output block OUT. The first overlap region OR1 extends in the second direction D2. The first overlap region OR1 may extend from the output block OUT to the second clock driver block CLD2 in the second direction D2. The first overlap region OR1 may substantially overlap with the second power line M1_R2. The first overlap region OR1 may have the first width W1 in the first direction D1. The first width W1 may be substantially equal to the second width W2.

Figure 11:
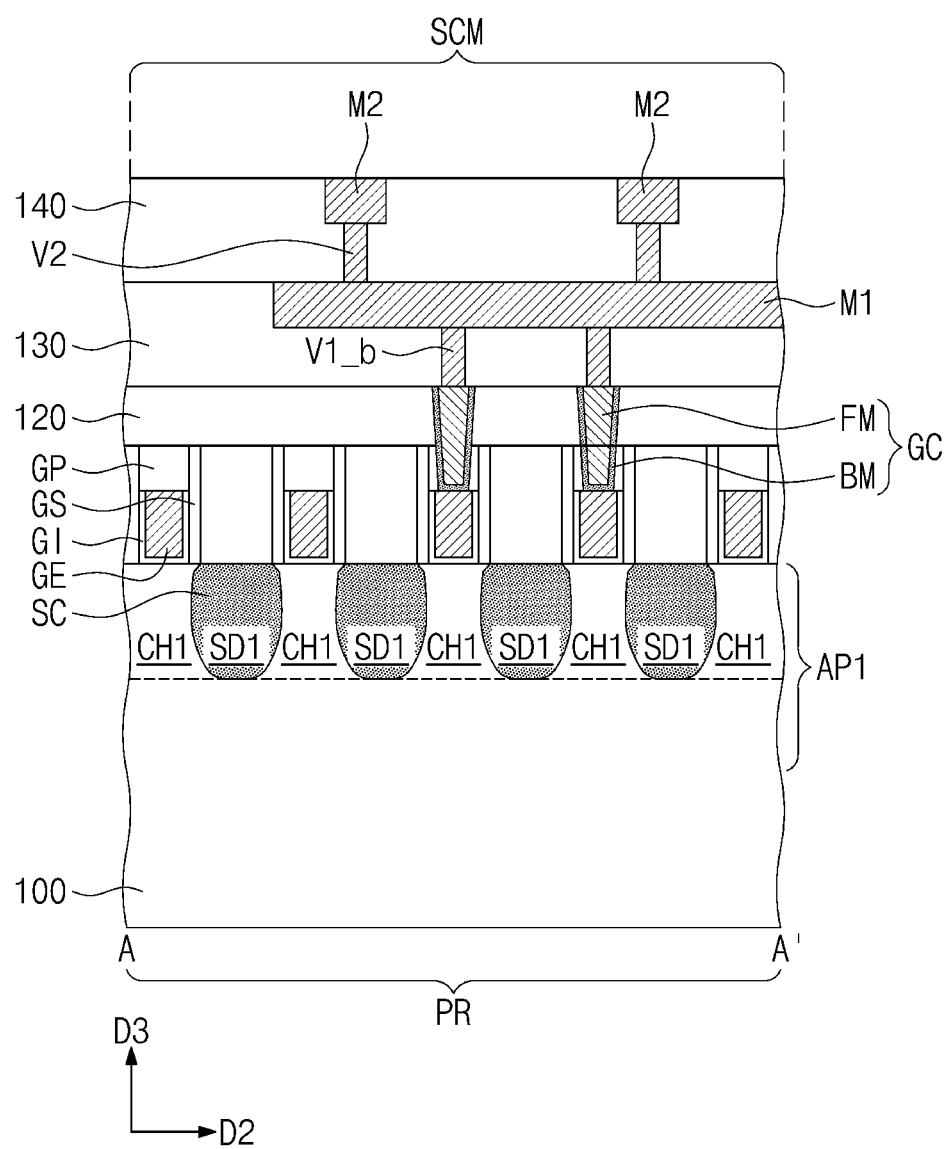
FIG. 11 is a sectional view, which is taken along a line A-A' of FIG. 3 to illustrate a semiconductor device according to an embodiment of the inventive concept.
Figure 12A:
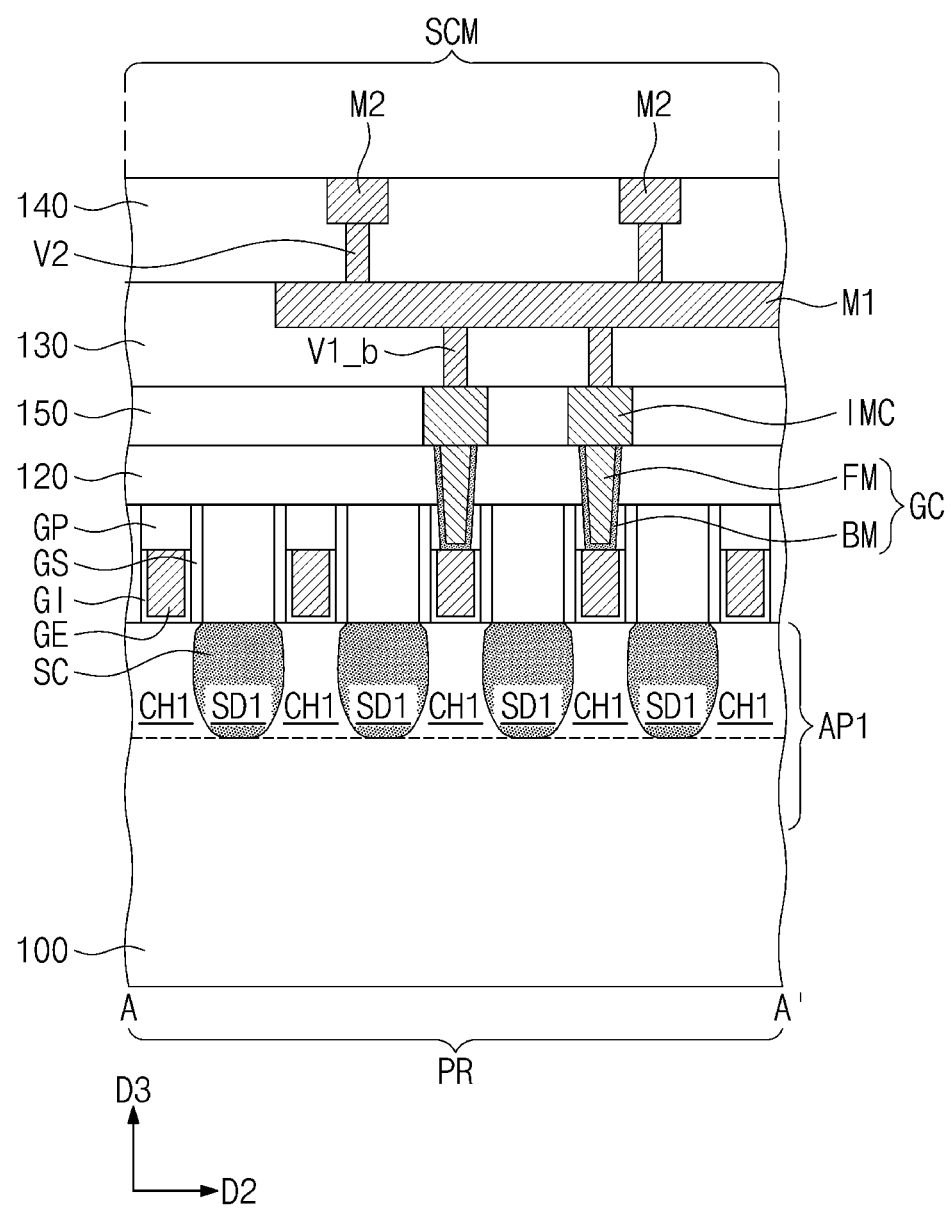
FIGS. 12A and 12B are sectional views, which are taken along lines A-A' and B-B' of FIG. 3 to illustrate a semiconductor device according to other embodiments of the inventive concept.
Figure 12B:
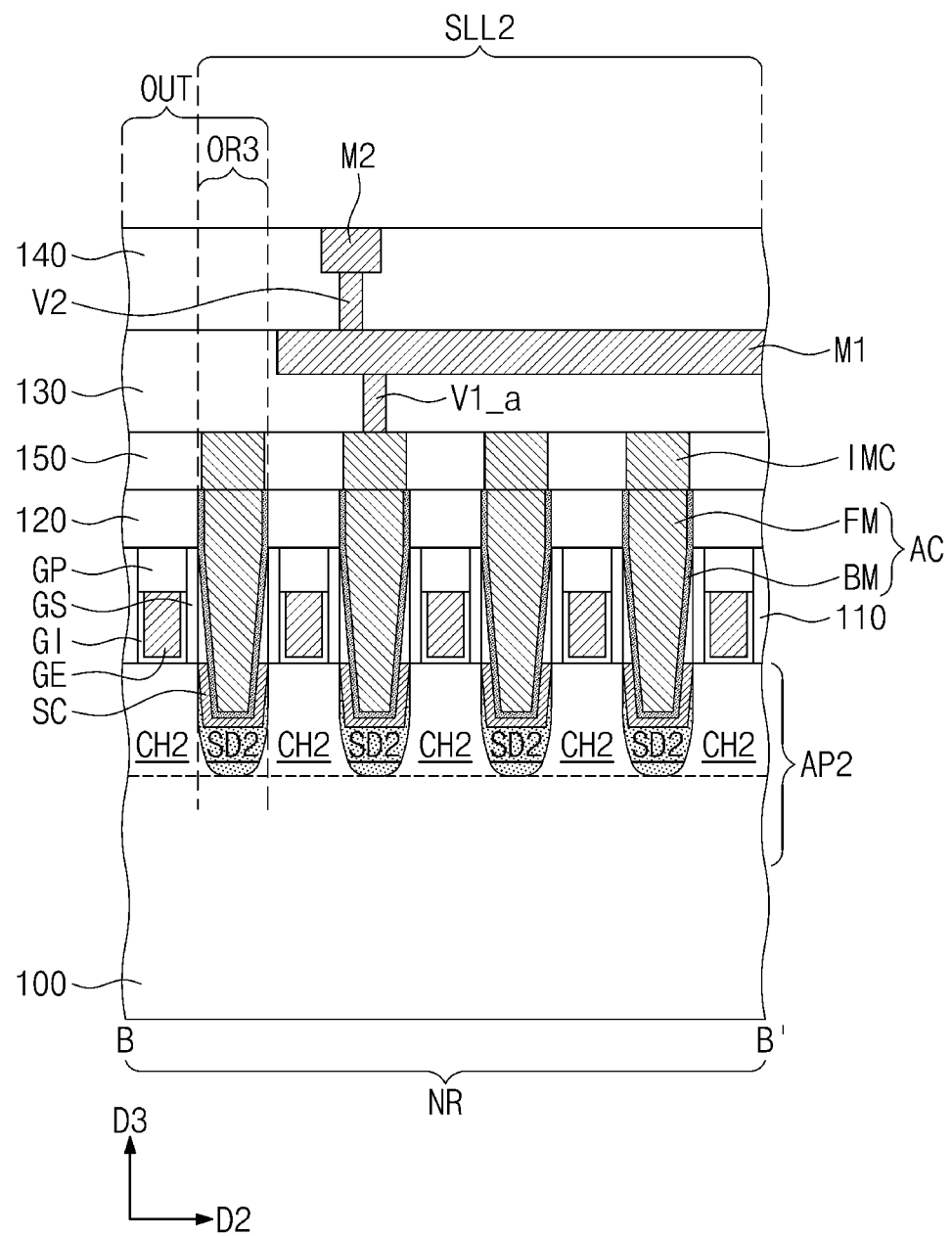
Figure 13A:
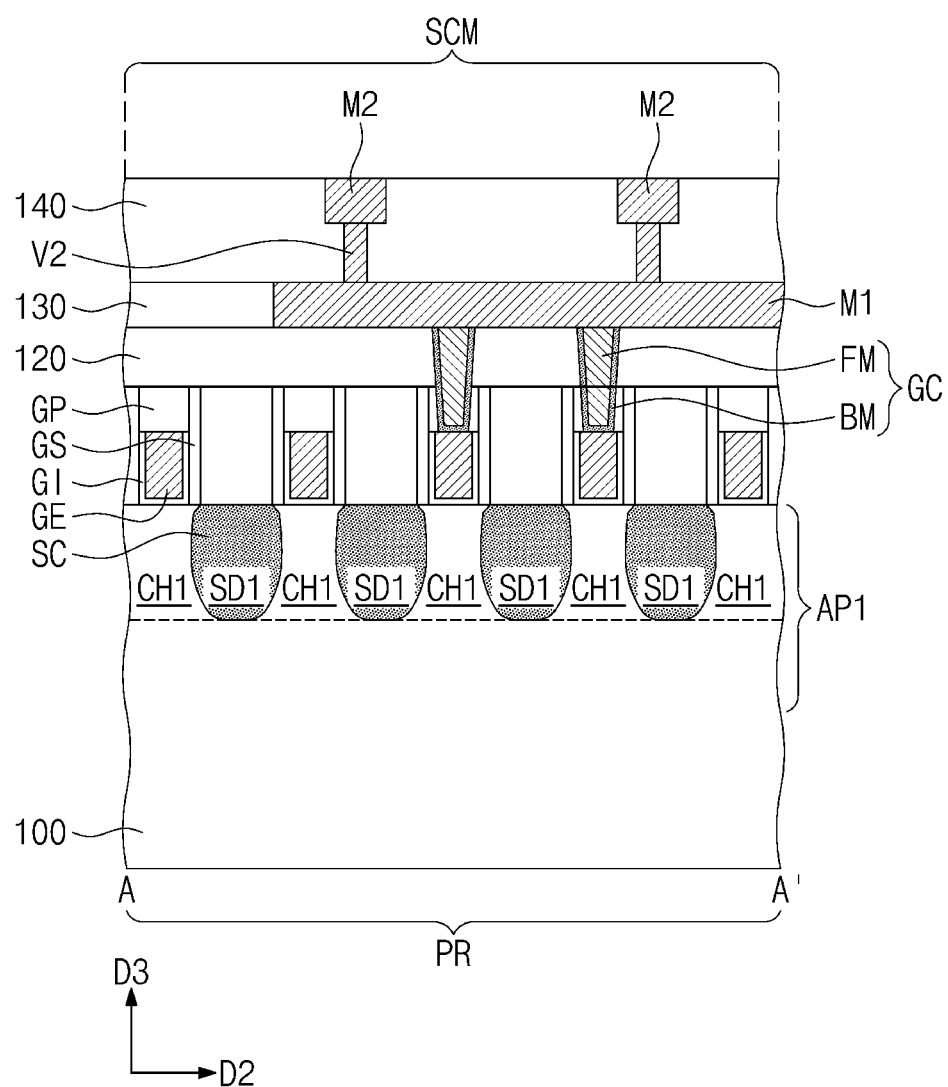
FIGS. 13A and 13B are sectional views, which are taken along lines A-A' and B-B' of FIG. 3 to illustrate a semiconductor device according to still other embodiments of the inventive concept.
Figure 13B:
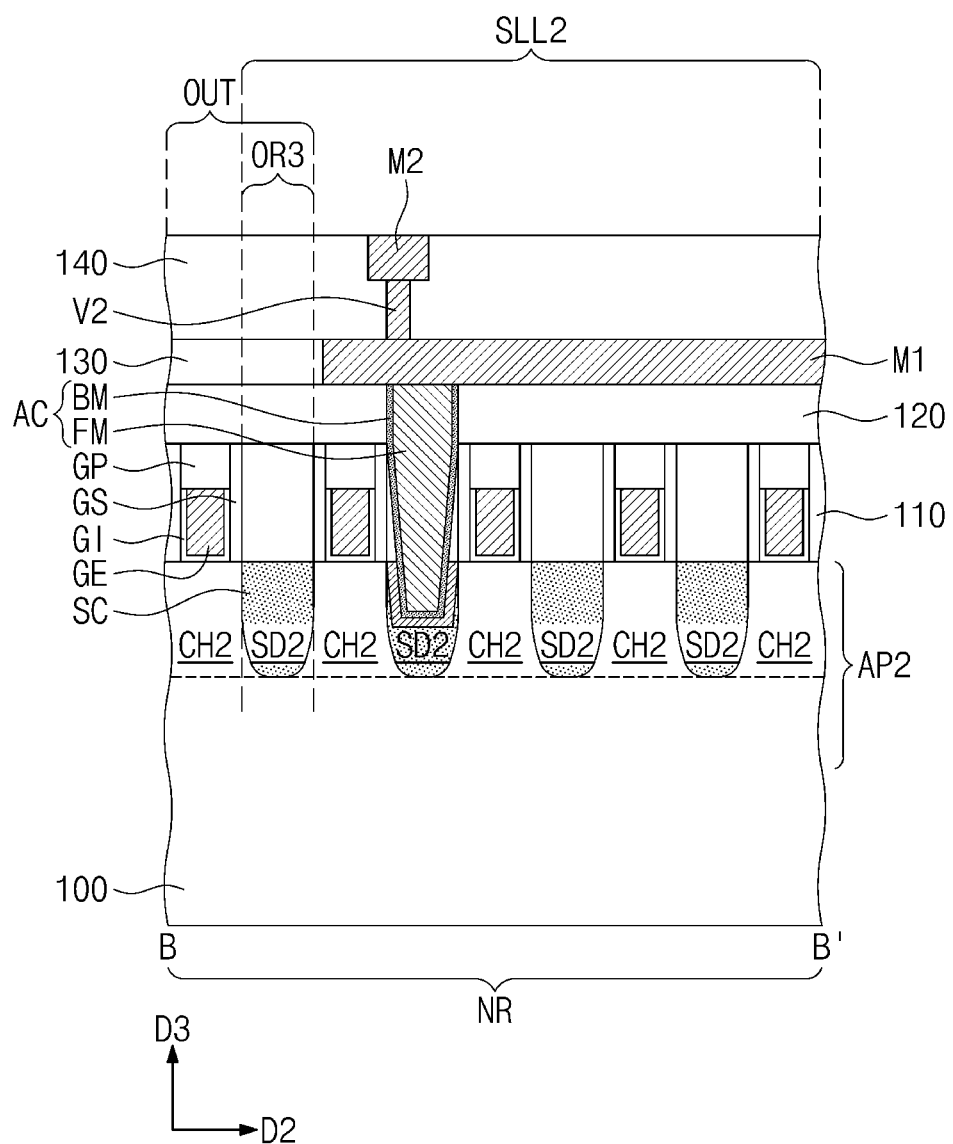

FIG. 11 is a sectional view, which is taken along a line A-A' of FIG. 3 to illustrate a semiconductor device according to an embodiment of the inventive concept. FIGS. 12A and 12B are sectional views, which are taken along lines A-A' and B-B' of FIG. 3 to illustrate a semiconductor device according to other embodiments of the inventive concept. FIGS. 13A and 13B are sectional views, which are taken along lines A-A' and B-B' of FIG. 3 to illustrate a semiconductor device according to still other embodiment of the inventive concept. In the following description, an element previously described with reference to FIGS. 3, 4, 5 and 6A to 6D may be identified by the same reference number without repeating an overlapping description thereof.

Referring to FIG. 11, gate contacts GC may be provided to penetrate the second interlayered insulating layer 120 and the gate capping patterns GP and may be electrically connected to the gate electrodes GE, respectively. The gate contacts GC may have top surfaces that are coplanar with a top surface of the second interlayered insulating layer 120. For example, the top surfaces of the gate contacts GC may be coplanar with the top surfaces of the active contacts AC of FIG. 6B.

The gate contact GC may include a conductive pattern FM and a barrier pattern BM surrounding the conductive pattern FM. The conductive pattern FM and the barrier pattern BM of the gate contact GC may be configured to have substantially the same features as those in the active contact AC described above.

The second lower via V1_b may be provided on the gate contact GC. The gate electrode GE and the first interconnection line M1 may be electrically connected to each other through the gate contact GC and the second lower via V1_b.

Referring to FIGS. 12A and 12B, a fifth interlayered insulating layer 150 may be additionally interposed between the second interlayered insulating layer 120 and the third interlayered insulating layer 130. Intermediate contacts IMC may be provided in the fifth interlayered insulating layer 150. At least one of the intermediate contacts IMC may be interposed between the active contact AC and the first lower via V1_a. At least one of the intermediate contacts IMC may be interposed between the gate contact GC and the second lower via V1_b.

Referring to FIGS. 13A and 13B, the first and second lower vias V1_a and V1_b may be omitted. A top surface of the active contact AC may contact a bottom surface of the first interconnection line M1. A top surface of the gate contact GC may contact the bottom surface of the first interconnection line M1. As used herein, items described as contacting each other, or in contact with each other, are directly connected (e.g., touching).

Figure 14A:
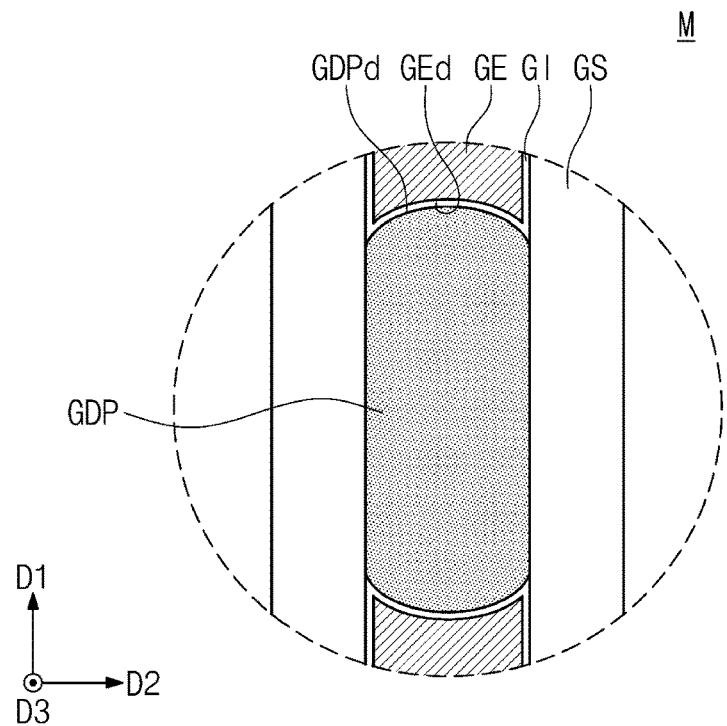
FIGS. 14A to 14C are enlarged plan views, each of which illustrates a portion (e.g., 'M' of FIG. 3) of a semiconductor device according to an embodiment of the inventive concept.
Figure 14B:
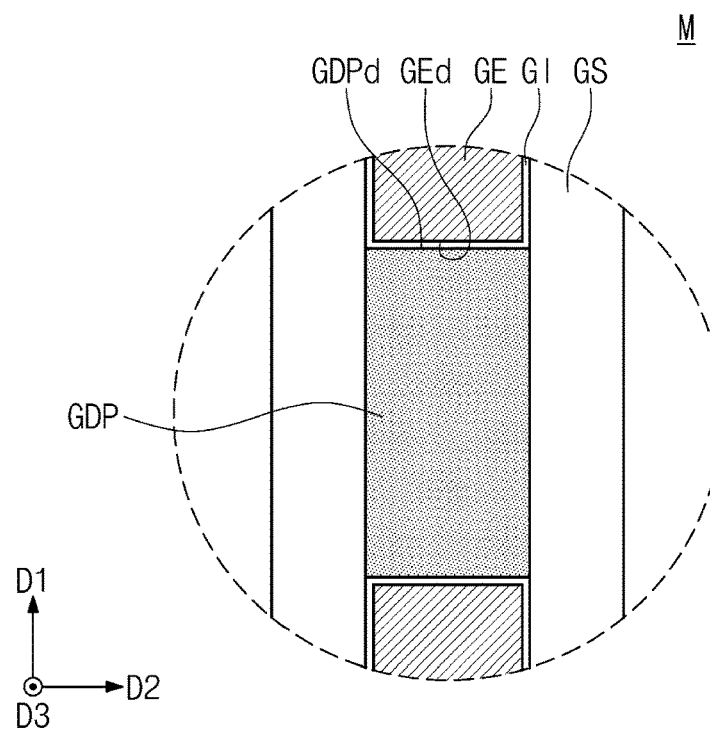
Figure 14C:
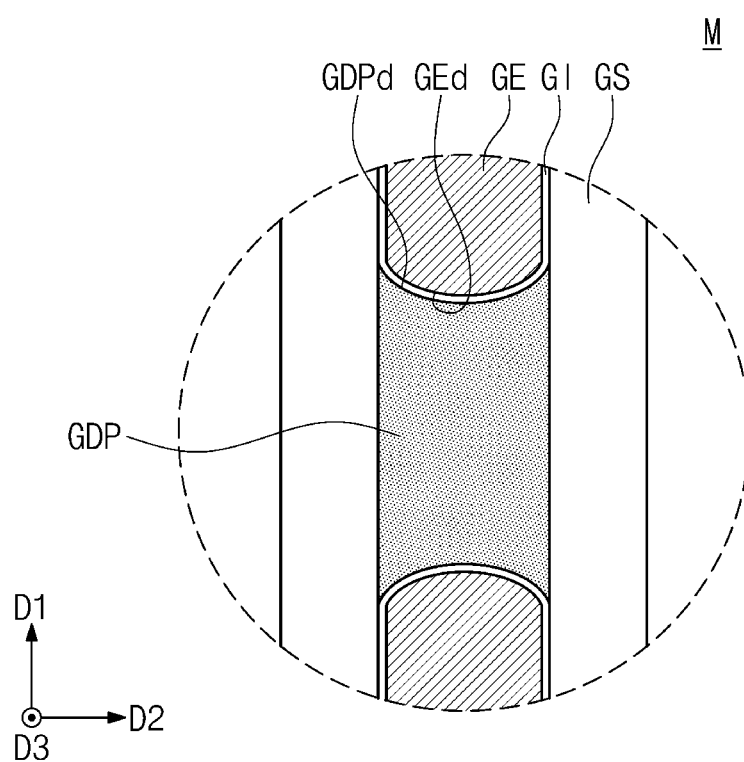

FIGS. 14A to 14C are enlarged plan views, each of which illustrates a portion (e.g., 'M' of FIG. 3) of a semiconductor device according to an embodiment of the inventive concept. In the following description, an element previously described with reference to FIGS. 3, 4, 5 and 6A to 6D may be identified by the same reference number without repeating an overlapping description thereof.

Referring to FIG. 14A, the gate separation pattern GDP may be interposed between the gate electrodes GE, which are adjacent to each other in the first direction D1. The gate separation pattern GDP may have an elliptical shape.

In detail, the gate separation pattern GDP may have an end portion GDPd facing the gate electrode GE. The gate electrode GE may have an end portion GEd facing the gate separation pattern GDP. The end portion GDPd of the gate separation pattern GDP may convexly protrude toward the gate electrode GE. The end portion GEd of the gate electrode GE may be concavely recessed to be fittingly engaged with the end portion GDPd of the gate separation pattern GDP. As shown in FIG. 14A, the gate separation region GDP may convexly protrude in the first direction toward a first gate electrode where it abuts the first gate electrode and convexly protrude in the first direction toward a second gate electrode where it abuts the second gate electrode.

Referring to FIG. 14B, the gate separation pattern GDP may be interposed between the gate electrodes GE, which are adjacent to each other in the first direction D1. The gate separation pattern GDP may have a rectangular shape. In detail, the end portion GDPd of the gate separation pattern GDP may be parallel to the second direction D2. The end portion GEd of the gate electrode GE may be parallel to the second direction D2.

Referring to FIG. 14C, the gate separation pattern GDP may be interposed between the gate electrodes GE, which are adjacent to each other in the first direction D1. In detail, the end portion GEd of the gate electrode GE may convexly protrude toward the gate separation pattern GDP. The end portion GDPd of the gate separation pattern GDP may be concavely recessed to be fittingly engaged with the end portion GEd of the gate electrode GE.

Figure 15:
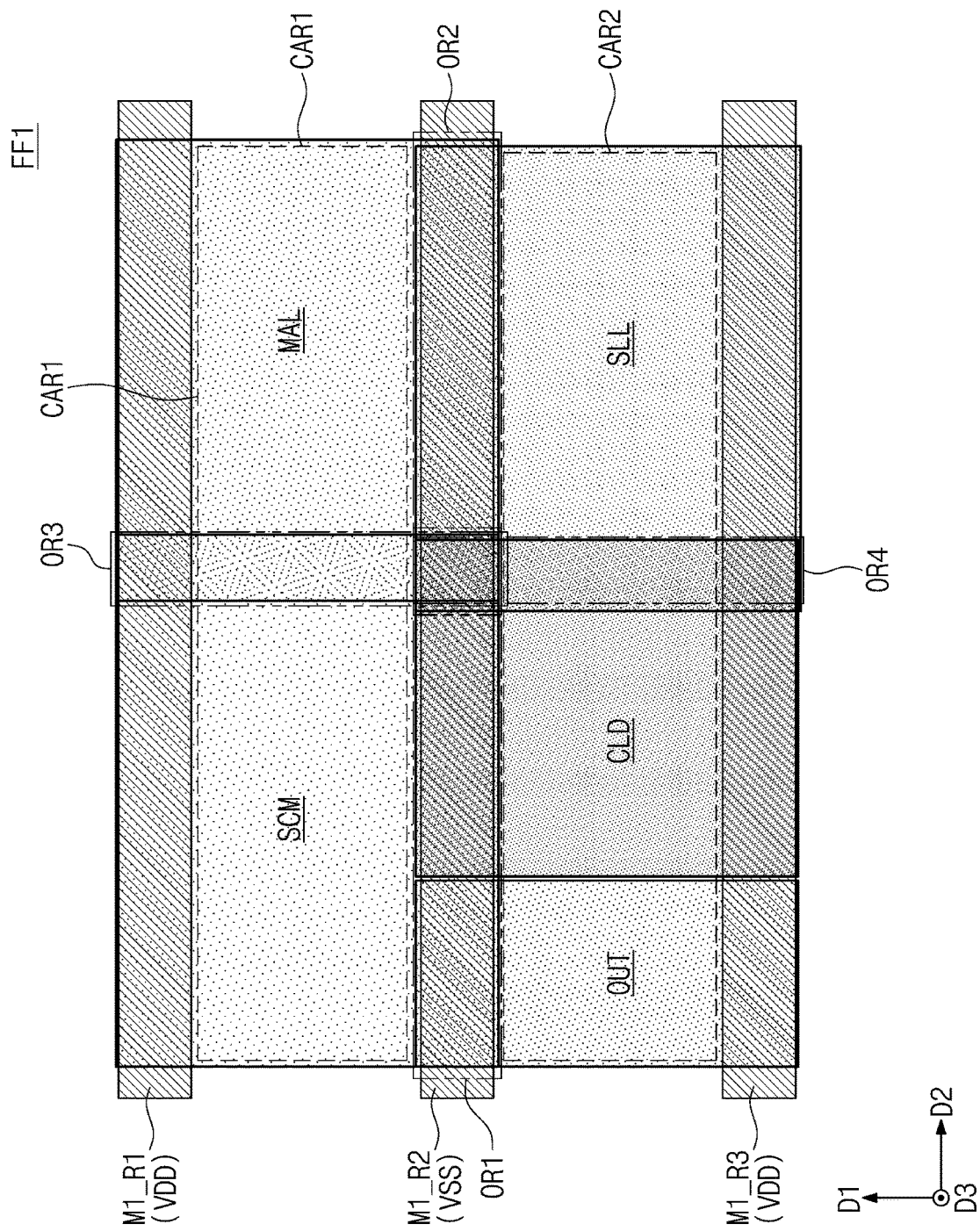
FIGS. 15, 16, and 17 are plan views, each of which illustrates a plurality of blocks constituting a flip-flop cell according to an embodiment of the inventive concept.
Figure 16:
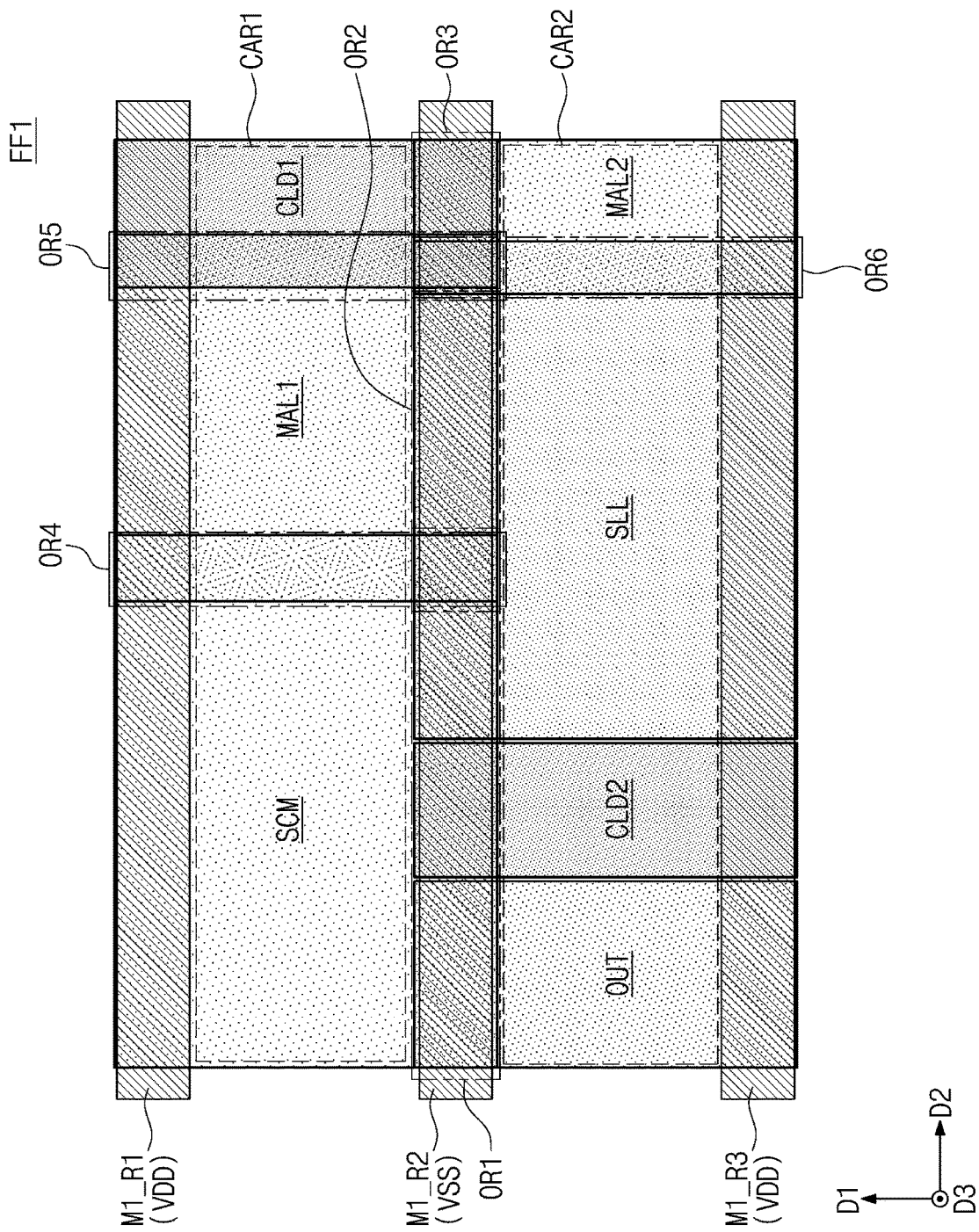
Figure 17:
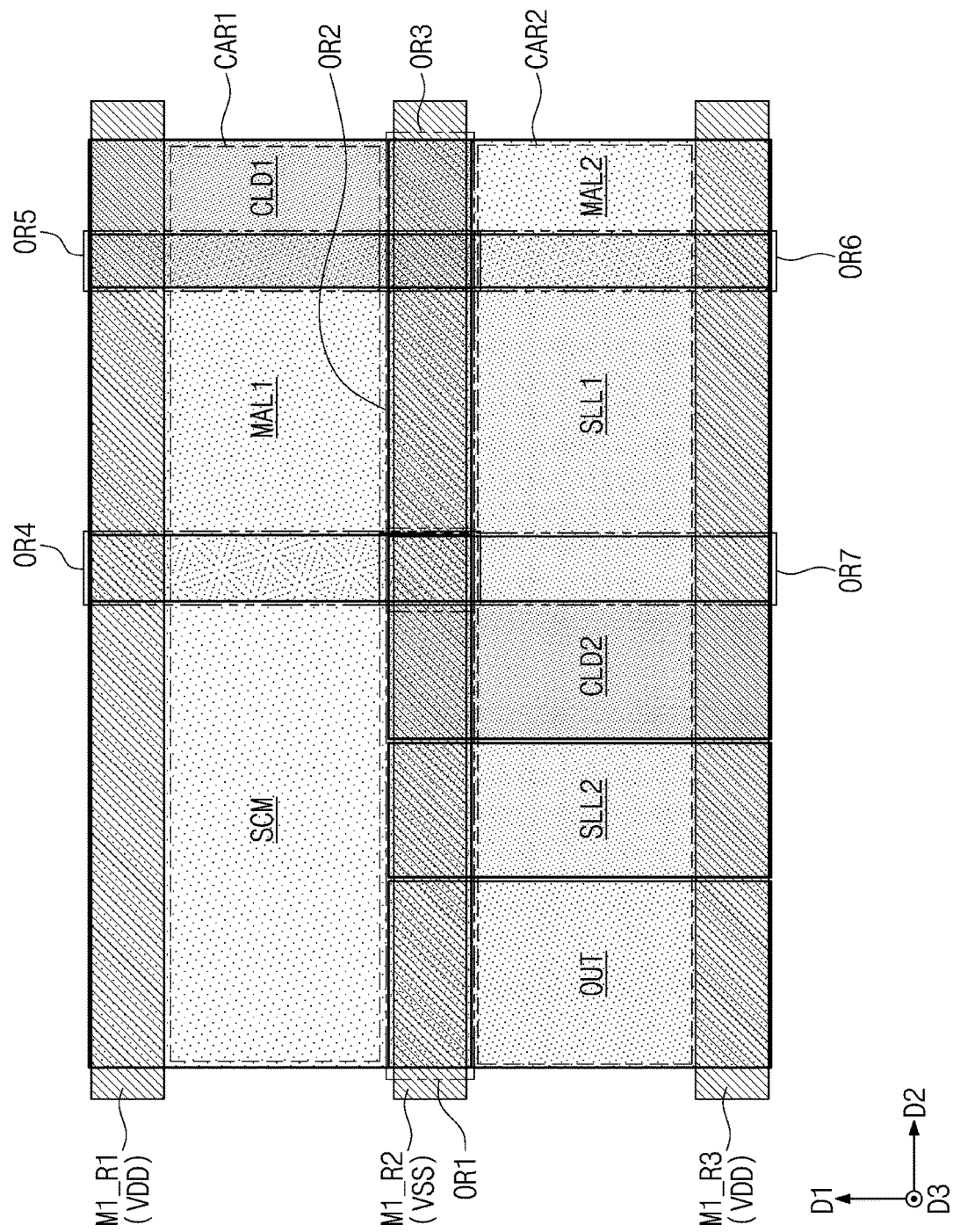

FIGS. 15, 16, and 17 are plan views, each of which illustrates a plurality of blocks constituting a flip-flop cell according to an embodiment of the inventive concept. In the following description, an element previously described with reference to FIGS. 1 to 5 may be identified by the same reference number without repeating an overlapping description thereof.

Referring to FIG. 15, the first flip-flop cell FF1 includes the scan MUX block SCM, the master latch block MAL, the slave latch block SLL, the clock driver block CLD, and the output block OUT. In the present embodiment, each of the scan MUX block SCM, the master latch block MAL, the slave latch block SLL, the clock driver block CLD, and the output block OUT have a rectangular shape.

The scan MUX block SCM and the master latch block MAL are provided on the first active region CAR1. The master latch block MAL is adjacent to the scan MUX block SCM in the second direction D2.

In the third overlap region OR3, the scan MUX block SCM and the master latch block MAL overlap with each other. The third overlap region OR3 extends in the first direction D1. The scan MUX block SCM and the master latch block MAL share the first active region CAR1 through the third overlap region OR3. The first active region CAR1, which is shared by the scan MUX block SCM and the master latch block MAL, is a region, to which the first power line M1_R1 and the second power line M1_R2 are electrically connected.

The slave latch block SLL, the clock driver block CLD, and the output block OUT are provided on the second active region CAR2. The output block OUT, the clock driver block CLD, and the slave latch block SLL are sequentially arranged in the second direction D2.

In the fourth overlap region OR4, the clock driver block CLD and the slave latch block SLL overlap with each other. The fourth overlap region OR4 extends in the first direction D1. The clock driver block CLD and the slave latch block SLL share the second active region CAR2 through the fourth overlap region OR4. The second active region CAR2, which is shared by the clock driver block CLD and the slave latch block SLL, is a region, to which the second power line M1_R2 and the third power line M1_R3 are electrically connected.

In the first overlap region OR1, the scan MUX block SCM overlaps with the clock driver block CLD and the output block OUT. In the second overlap region OR2, the master latch block MAL and the slave latch block SLL overlap with each other. Each of the first and second overlap regions OR1 and OR2 may extend in the second direction D2. The first and second overlap regions OR1 and OR2 may substantially overlap with the second power line M1_R2.

Referring to FIG. 16, the first flip-flop cell FF1 may include the scan MUX block SCM, a first master latch block MAL1, a second master latch block MAL2, the slave latch block SLL, the first clock driver block CLD1, the second clock driver block CLD2, and the output block OUT. In the present embodiment, each of the scan MUX block SCM, the first master latch block MAL1, the second master latch block MAL2, the slave latch block SLL, the first clock driver block CLD1, the second clock driver block CLD2, and the output block OUT have a rectangular shape.

The scan MUX block SCM, the first master latch block MAL1, and the first clock driver block CLD1 are provided on the first active region CAR1. The scan MUX block SCM, the first master latch block MAL1, and the first clock driver block CLD1 are sequentially arranged in the second direction D2.

In the fourth overlap region OR4, the scan MUX block SCM and the first master latch block MAL1 overlap with each other. In a fifth overlap region OR5, the first master latch block MAL1 and the first clock driver block CLD1 overlap with each other. Each of the fourth and fifth overlap regions OR4 and OR5 extend in the first direction D1.

The second master latch block MAL2, the slave latch block SLL, the second clock driver block CLD2, and the output block OUT are provided on the second active region CAR2. The output block OUT, the second clock driver block CLD2, the slave latch block SLL, and the second master latch block MAL2 are sequentially arranged in the second direction D2.

In a sixth overlap region OR6, the slave latch block SLL and the second master latch block MAL2 overlap with each other. The sixth overlap region OR6 extends in the first direction D1.

In the first overlap region OR1, the scan MUX block SCM overlaps with the slave latch block SLL, the second clock driver block CLD2, and the output block OUT. In the second overlap region OR2, the first master latch block MAL1 and the slave latch block SLL overlap with each other. In the third overlap region OR3, the first clock driver block CLD1 and the second master latch block MAL2 overlap with each other. Each of the first to third overlap regions OR1, OR2, and OR3 extend in the second direction D2. The first to third overlap regions OR1, OR2, and OR3 may substantially overlap with the second power line M1_R2.

Referring to FIG. 17, the first flip-flop cell FF1 may include the scan MUX block SCM, the first master latch block MAL1, the second master latch block MAL2, the first slave latch block SLL1, the second slave latch block SLL2, the first clock driver block CLD1, the second clock driver block CLD2, and the output block OUT. In the present embodiment, each of the scan MUX block SCM, the first master latch block MAL1, the second master latch block MAL2, the first slave latch block SLL1, the second slave latch block SLL2, the first clock driver block CLD1, the second clock driver block CLD2, and the output block OUT have a rectangular shape.

The second master latch block MAL2, the first slave latch block SLL1, the second slave latch block SLL2, the second clock driver block CLD2, and the output block OUT are provided on the second active region CAR2. The output block OUT, the second slave latch block SLL2, the second clock driver block CLD2, the first slave latch block SLL1, and the second master latch block MAL2 are sequentially arranged in the second direction D2.

In the sixth overlap region OR6, the slave latch block SLL and the second master latch block MAL2 overlap with each other. In a seventh overlap region OR7, in which the second clock driver block CLD2 and the first slave latch block SLL1 overlap with each other, may be defined. Each of the sixth and seventh overlap regions OR6 and OR7 extend in the first direction D1.

In the first overlap region OR1, the scan MUX block SCM overlaps with the second slave latch block SLL2, the second clock driver block CLD2, and the output block OUT. In the second overlap region OR2, the first master latch block MAL1 and the first slave latch block SLL1 overlap with each other. In the third overlap region OR3, the first clock driver block CLD1 and the second master latch block MAL2 overlap with each other. Each of the first to third overlap regions OR1, OR2, and OR3 extend in the second direction D2. The first to third overlap regions OR1, OR2, and OR3 may substantially overlap with the second power line M1_R2.

According to an embodiment of the inventive concept, a semiconductor device may include function blocks, which constitute a flip-flop cell and are efficiently disposed on a cell, and thus, it may be possible to improve performance of a flip-flop circuit.

While example embodiments of the inventive concepts have been particularly shown and described, it will be understood by one of ordinary skill in the art that variations in form and detail may be made therein without departing from the spirit and scope of the attached claims. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

What is claimed is:

1. A semiconductor device including a flip flop cell, the flip flop cell formed on a semiconductor substrate and including a flip flop circuit, and the flip flop cell comprising:
   active regions extending lengthwise in a first direction, from a plan view;
   gate electrodes extending lengthwise in a second direction perpendicular to the first direction, from the plan view;
   a power line extending lengthwise in the first direction, from the plan view;
   a clock driver circuit;

a scan MUX circuit formed in a first continuously-bounded area of the flip flop cell from the plan view such that the scan MUX circuit generates a scan MUX circuit output, the first continuously-bounded area having a quadrilateral shape;

a master latch circuit formed in a second continuously-bounded area of the flip flop cell from the plan view, the master latch circuit formed to be adjacent to the scan MUX circuit in the first direction and connected to receive the scan MUX circuit output from the scan MUX circuit and output a master latch circuit output;

the clock driver circuit formed in at least a third continuously-bounded area of the flip flop cell from the plan view, the third continuously-bounded area partly overlapping the first continuously-bounded area in a first overlap region where the power line is disposed, and partly not overlapping the first continuously-bounded area, such that a first part of the scan mux circuit in the first overlap region overlaps and is shared with a first part of the clock driver circuit in the first overlap region, a second part of the scan mux circuit that is not shared with and does not overlap the clock driver circuit is adjacent to the power line in the second direction, and a second part of the clock driver circuit is adjacent to the power line on an opposite side of the power line as the second part of the scan mux circuit in the second direction;

a slave latch circuit formed in a fourth continuously-bounded area of the flip flop cell from the plan view and a fifth continuously-bounded area of the flip flop cell separate from the fourth continuously-bounded area, and connected to receive the master latch circuit output and output a slave latch circuit output, the fourth continuously-bounded area partly overlapping the first continuously-bounded area in a second overlap region where the power line is disposed; and an output circuit formed in a sixth continuously-bounded area of the flip flop cell from a plan view and connected to receive the slave latch circuit output and to output an output signal to an outside of the flip flop, wherein each of the scan mux circuit, the master latch circuit, the slave latch circuit, the clock driver circuit, and the output circuit:
consists of a plurality of active devices which together output a resulting signal for that circuit based on inputs, and
is a sub-circuit of the flip flop circuit, wherein:
a first set of devices of the plurality of active devices which together output the slave latch circuit output for the slave latch circuit is located in the fourth continuously-bounded area,
the remainder of the devices of the plurality of active devices which together output the slave latch circuit output for the slave latch circuit are located in the fifth continuously-bounded area,
the third continuously-bounded area is located between the fourth continuously-bounded area and the fifth continuously-bounded area in the first direction,
the slave latch circuit consists of two continuously-bounded areas each having a rectangular shape, and
the clock driver circuit consists of one or two continuously-bounded areas, each having a rectangular shape.

2. The semiconductor device of claim 1, wherein:
the first part of the scan mux circuit and the first part of the clock driver circuit share the power line disposed in the first overlap region.

3. The semiconductor device of claim 1, wherein:
in a second overlap region, part of the fourth continuously-bounded area overlaps part of the sixth continuously-bounded area; and
the output circuit and the slave latch circuit share a source/drain region in the second overlap region.

4. The semiconductor device of claim 1, further comprising:
a first active device that is part of the scan MUX circuit and is part of the clock driver circuit, and is located in the first overlap region.

5. The semiconductor device of claim 4, wherein:
the first active device is a transistor that includes a source/drain region that is shared by the scan MUX circuit and the clock driver circuit.

6. The semiconductor device of claim 1, wherein:
the scan mux circuit, the master latch circuit, the slave latch circuit, the clock driver circuit, and the output circuit are arranged within a rectangular area from the plan view and are arranged such that:
the scan mux circuit and master latch circuit are arranged at the same plan height as each other and are arranged adjacent to each other in a plan length direction which is the first direction; and
the slave latch circuit and the output circuit are arranged at the same plan height as each other below the plan height of the scan mux circuit and master latch circuit and are arranged with respect to each other along the plan length direction.

7. The semiconductor device of claim 6, wherein:
the output circuit has borders on two adjacent sides of the rectangular area.

8. The semiconductor device of claim 1, further comprising:
a shared conductive via contacting and electrically connected to the first power line, disposed below the first power line;
a first active contact connected to the shared conductive via and a source/drain pattern of the scan MUX circuit; and
a second active contact connected to the shared conductive via and a source/drain pattern of the clock driver circuit,
wherein the first overlap region is horizontally between the source/drain pattern of the scan MUX circuit and the source/drain pattern of the clock driver circuit.

9. The semiconductor device of claim 1, further comprising:
a shared conductive via contacting and electrically connected to the first power line, disposed below the first power line;
a first active contact connected to the shared conductive via and a source/drain pattern of the scan MUX circuit; and
a second active contact connected to the shared conductive via and a source/drain pattern of the clock driver circuit,
wherein the source/drain pattern of the scan MUX circuit is in the first continuously-bounded area and is outside the first overlap region,
wherein the source/drain pattern of the clock driver circuit is in the third continuously-bounded area and is outside the first overlap region, and
wherein the first active contact is horizontally separated from the second active contact.

10. The semiconductor device of claim 1, wherein:
the plurality of active regions are arranged in the second direction on the semiconductor substrate,
a plurality of adjacent active contacts are respectively formed on and electrically connected to the plurality of adjacent active regions, each adjacent active contact being separated from a next adjacent active contact by a separation distance in the second direction,
wherein a separation distance in the first overlap region between adjacent active contacts is smaller than a separation distance outside of the first overlap region between adjacent active contacts.

11. The semiconductor device of claim 1, wherein:
the active regions are a plurality of adjacent regions arranged in the second direction on the semiconductor substrate, and further comprising:
a plurality of adjacent active contacts respectively formed on and electrically connected to the plurality of adjacent active regions, each adjacent active contact being separated from a next adjacent active contact by a separation distance in the second direction;
a first gate electrode crossing the first overlap region and two of the active regions separated by the first overlap region;
a second gate electrode adjacent the first gate electrode in the second direction; and
a gate separation region between the first gate electrode and the second gate electrode, the gate separation region convexly protruding in the second direction toward the first gate electrode where it abuts the first gate electrode and convexly protruding in the second direction toward the second gate electrode where it abuts the second gate electrode.

12. The semiconductor device of claim 1, wherein:
at least part of the clock driver circuit that is not shared with the slave latch circuit is between the fourth continuously-bounded area and the fifth continuously-bounded area, in the plan view.

13. A semiconductor device including a flip flop cell, the flip flop cell formed on a semiconductor substrate and including a flip flop circuit, and the flip flop cell comprising:
 a scan mux circuit;
 a master latch circuit;
 a slave latch circuit;
 a clock driver circuit; and
 an output circuit,
 wherein each of the scan mux circuit, the master latch circuit, the slave latch circuit, the clock driver circuit, and the output circuit:
 consists of a plurality of active devices which together output a resulting signal for that circuit based on inputs,
 is a sub-circuit of the flip flop circuit, and
 occupies a continuously-bounded area of the flip flop circuit from a plan view, and
 wherein at least a first sub-circuit and a second sub-circuit of the sub-circuits overlap from the plan view in a first overlap region, the first overlap region including part of a first continuously-bounded area for the first sub-circuit and part of a second continuously-bounded area for the second sub-circuit, and
 wherein:
  the plurality of active devices which together output a resulting signal for the scan mux circuit are in the first continuously-bounded area,
  at least some of the plurality of active devices which together output a resulting signal for the clock driver circuit are in the second continuously-bounded area,
  at least some of the plurality of active devices which together output a resulting signal for the slave latch circuit are in a third continuously-bounded area,
  the remainder of the active devices which together output the resulting signal for the slave latch circuit are in a fourth continuously-bounded area, wherein the second continuously-bounded area is between the third continuously-bounded area and the fourth continuously-bounded area, in a second direction perpendicular to a first direction,
  the slave latch circuit consists of two continuously-bounded areas each having a quadrilateral shape,
  the clock driver circuit consists of one or two continuously-bounded areas, each having a quadrilateral shape, and
  the scan MUX circuit cons continuously bounded area having a quadrilateral shape;
 the flip flop cell further comprising:
 a plurality of adjacent active regions arranged in the first direction on the semiconductor substrate;
 a plurality of adjacent active contacts respectively formed on and electrically connected to the plurality of adjacent active regions, each adjacent active contact being separated from a next adjacent active contact by a separation distance in the first direction; and
 a first gate electrode crossing the first overlap region and two of the active regions separated by the first overlap region,
 wherein the plurality of adjacent active regions are fin-type FET active regions or the plurality of adjacent active regions are gate-all-around type FET active regions.

\* \* \* \* \*